United States Patent
Cao et al.

(10) Patent No.: US 9,503,025 B2
(45) Date of Patent: Nov. 22, 2016

(54) POWER AMPLIFIER WITH TERMINATION CIRCUIT AND RESONANT CIRCUIT

(71) Applicant: Skyworks Solutions, Inc., Woburn, MA (US)

(72) Inventors: Haibo Cao, Thousand Oaks, CA (US); Andy Cheng Pang Wu, Camarillo, CA (US); Yu-Jui Lin, Glendale, CA (US); Joel Richard King, Newbury Park, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 14/671,079

(22) Filed: Mar. 27, 2015

(65) Prior Publication Data
US 2016/0013758 A1    Jan. 14, 2016

Related U.S. Application Data

(60) Provisional application No. 62/023,716, filed on Jul. 11, 2014.

(51) Int. Cl.
*H03F 3/191*    (2006.01)
*H03F 1/02*    (2006.01)
(Continued)

(52) U.S. Cl.
CPC ............ *H03F 1/0222* (2013.01); *H03F 1/565* (2013.01); *H03F 3/191* (2013.01); *H03F 3/217* (2013.01); *H03F 3/245* (2013.01); *H03F 3/68* (2013.01); *H03F 2200/102* (2013.01); *H03F 2200/111* (2013.01); *H03F 2200/451* (2013.01)

(58) Field of Classification Search
CPC ....................................................... H03F 3/191

USPC ................................................. 330/302, 305
See application file for complete search history.

(56) References Cited

U.S. PATENT DOCUMENTS

| | | |
|---|---|---|
| 4,717,884 A | 1/1988 | Mitzlaff |
| 5,146,178 A | 9/1992 | Nojima et al. |
| (Continued) | | |

FOREIGN PATENT DOCUMENTS

| | | |
|---|---|---|
| WO | WO2006016299 | 2/2006 |

OTHER PUBLICATIONS

Kim, Bumman, et al., "Envelope Tracking Technique for Multimode PA Operation," In: Proceedings of the 39th European Microwave Conference, Sep. 29-Oct. 1, 2009, pp. 429-432.

(Continued)

*Primary Examiner* — Henry Choe
(74) *Attorney, Agent, or Firm* — Knobbe, Martens, Olson & Bear, LLP

(57) ABSTRACT

Aspects of this disclosure relate to efficient power amplifiers, such as class-F power amplifiers. A power amplifier transistor can provide an amplified RF signal. A termination can be coupled to an output of the power amplifier transistor and configured to provide a short circuit at a second harmonic. In some instances, the termination circuit can provide an open circuit at a third harmonic. A resonant circuit can be coupled to the output terminal of the power amplifier transistor and configured to provide an open circuit at the third harmonic. In certain embodiments, an input termination circuit coupled to an input terminal of the power amplifier transistor can provide a short circuit at the second harmonic. The power amplifiers of this disclosure can be implemented, for example, in envelope tracking applications.

20 Claims, 13 Drawing Sheets

(51) Int. Cl.
  *H03F 1/56*     (2006.01)
  *H03F 3/217*    (2006.01)
  *H03F 3/24*     (2006.01)
  *H03F 3/68*     (2006.01)

(56) References Cited

U.S. PATENT DOCUMENTS

| | | | |
|---|---|---|---|
| 5,300,895 A * | 4/1994 | Jones | H03F 3/191 |
| | | | 330/251 |
| 5,347,229 A * | 9/1994 | Suckling | H03F 3/60 |
| | | | 330/251 |
| 6,535,069 B2 * | 3/2003 | Fujioka | H03F 3/193 |
| | | | 330/302 |
| 6,724,255 B2 | 4/2004 | Kee et al. | |
| 7,741,907 B2 | 6/2010 | Takagi | |
| 7,920,029 B2 | 4/2011 | Blednov et al. | |
| 8,436,694 B2 * | 5/2013 | Van Bezooijen | H03F 1/56 |
| | | | 333/17.3 |
| 8,717,100 B2 | 5/2014 | Reisner et al. | |
| 8,983,406 B2 | 3/2015 | Zhang et al. | |
| 9,203,347 B2 * | 12/2015 | Jiang | H03F 1/0233 |
| 2007/0057731 A1 | 3/2007 | Le | |
| 2011/0163814 A1 * | 7/2011 | Hellberg | H03F 1/0205 |
| | | | 330/302 |
| 2013/0116017 A1 | 5/2013 | Zhang et al. | |
| 2013/0130752 A1 | 5/2013 | Zhang et al. | |
| 2015/0009980 A1 | 1/2015 | Modi et al. | |

OTHER PUBLICATIONS

Woo, Young Yun, et al. 'Analysis and Experiments for High-Efficiency Class-F and Inverse Class-F Power Amplifiers', In: IEEE Transactions on Microwave Theory and Techniques, vol. 54, No. 5, May 2006, pp. 1969-1974.

Collinson, Glenn, et al., "Effects of Harmonic Terminations on Power and Efficiency of GAAS HBT Power Amplifiers at 900MHZ", IEE Colloquium on Solid-State Power Amplifiers, Dec. 16, 1991, pp. 12/1-12/5.

* cited by examiner

POWER AMPLIFIER WITH TERMINATION CIRCUIT AND RESONANT CIRCUIT

CROSS-REFERENCE TO RELATED APPLICATION

This application claims the benefit of priority under 35 U.S.C. §119(e) of U.S. Provisional Patent Application No. 62/023,716, filed Jul. 11, 2014 and titled "CLASS-F POWER AMPLIFIER", the entire technical disclosure of which is herein incorporated by reference in its entirety.

BACKGROUND

1. Technical Field

Embodiments of the invention relate to electronic systems, and in particular, to radio frequency (RF) electronics.

2. Description of the Related Technology

RF power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, smart phones can include power amplifiers to amplify RF signals in accordance with a Long Term Evolution (LTE) standard. In such devices, there is a strong desire to increase battery life. Because RF power amplifiers can boost RF signals from relatively low power levels to higher power levels for signal transmission, increased efficiency of power amplifiers can be desirable to increase battery life. Accordingly, a need exists for improved power amplifiers.

SUMMARY OF CERTAIN INVENTIVE ASPECTS

The innovations described in the claims each have several aspects, no single one of which is solely responsible for its desirable attributes. Without limiting the scope of the claims, some prominent features will now be briefly described.

One aspect of this disclosure is an apparatus that includes a power amplifier transistor, an input termination circuit, a termination circuit, and a resonant circuit. The power amplifier transistor is configured to receive a radio frequency (RF) signal at an input terminal and provide an amplified RF signal at an output terminal. The input termination circuit is coupled to the input terminal of the power amplifier transistor. The input termination circuit is configured to provide a short circuit at a second harmonic of the RF signal. The termination circuit is coupled to the output terminal of the power amplifier transistor. The termination circuit is configured to provide a short circuit at a second harmonic of the amplified RF signal. The resonant circuit is coupled to the output of the power amplifier transistor. The resonant circuit is configured to provide an open circuit at a third harmonic of the amplified RF signal The termination circuit can also provide an open circuit at a third harmonic of the amplified RF signal. The termination circuit can include a capacitor in parallel with a series LC circuit.

The apparatus can include an envelope tracking modulator and a parallel LC circuit disposed between the envelope tracking modulator and the output terminal of the power amplifier transistor, in which the envelope tracking modulator configured to provide a supply voltage to the power amplifier transistor by way of the parallel LC circuit. The parallel LC circuit can block a fundamental frequency of the amplified RF signal.

The power amplifier transistor can include a bipolar transistor having a collector, a base, and an emitter, in which the input terminal of the power amplifier transistor is the base and the output terminal of the power amplifier transistor is the collector. The power amplifier transistor can be implemented on a power amplifier die, and the input termination circuit can include an inductive element external to the power amplifier die. The termination circuit can provide a short circuit at another even harmonic of the amplified RF signal. In certain implementations, the power amplifier transistor is implemented on a power amplifier die, the termination circuit includes a first LC circuit configured to provide the short circuit at the second harmonic of the amplified RF signal and a second LC circuit configured to provide the short circuit at the other even harmonic of the amplified RF signal, the first LC circuit includes a first inductive element external to the power amplifier die, and the second LC circuit includes a second inductive element external to the power amplifier die.

The resonant circuit can provide an open circuit at another odd harmonic of the amplified RF signal. The resonant circuit can include a parallel LC circuit. In some instances, an inductive element of the parallel LC circuit is implemented external to a power amplifier die that includes the power amplifier transistor.

Another aspect of this disclosure is an apparatus that includes a bipolar power amplifier transistor, a termination circuit and a parallel LC circuit. The bipolar power amplifier transistor has a collector, a base, and an emitter. The bipolar power amplifier transistor is configured to amplify a radio frequency (RF) signal received at the base. The bipolar power amplifier transistor is implemented on a power amplifier die. The termination circuit is coupled to the collector of the bipolar power amplifier transistor. The termination circuit includes a capacitor in parallel with a series LC circuit. The series LC circuit includes an inductive element external to the power amplifier die. The parallel LC circuit is coupled in series between the collector and a load.

The bipolar power amplifier transistor, the termination circuit, and the parallel LC circuit can be arranged as a class F power amplifier. A second series LC circuit can be coupled to the base of the bipolar power amplifier transistor. An envelope tracking modulator can be configured to provide a supply voltage for the collector of the bipolar power amplifier transistor. A second parallel LC circuit can be disposed between the envelope tracking modulator and the collector, in which the envelope tracking modulator can provide the supply voltage to the collector by way of the second parallel LC circuit. The termination circuit can include a second series LC circuit in parallel with the series LC circuit, in which the second series LC circuit includes the capacitor.

Another aspect of this disclosure is a power amplifier module that includes a power amplifier transistor, a termination circuit, a resonant circuit, and a supply voltage circuit. The power amplifier transistor is configured to receive a radio frequency (RF) input signal and provide an amplified RF signal. The termination circuit is coupled to an output of the power amplifier transistor. The termination circuit is configured to provide a short circuit at a second harmonic of the amplified RF signal and an open circuit at a third harmonic of the amplified RF signal. The resonant circuit is coupled to the output of the power amplifier transistor. The resonant circuit is configured to provide an open circuit at the third harmonic of the amplified RF signal.

The supply voltage circuit includes an envelope tracking modulator and a parallel LC circuit disposed between the envelope tracking modulator and the power amplifier transistor. The envelope tracking modulator is configured to provide a supply voltage to the power amplifier transistor by way of the parallel LC circuit.

The power amplifier transistor can include a bipolar transistor, such as a heterojunction bipolar transistor, having a base configured to receive the RF input signal. The power amplifier module can include an input termination circuit coupled to the base, and the input termination circuit can be configured to provide a short circuit at a second harmonic of the RF input signal.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings, in which.

DETAILED DESCRIPTION OF CERTAIN EMBODIMENTS

Figure 1B:
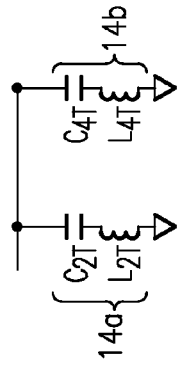
FIG. 1B is a schematic diagram of a portion of the termination circuit of FIG. 1A.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that embodiments can include more elements than illustrated in a particular drawing and/or a subset of the illustrated elements.

There is an ever growing need to increase the power added efficiency (PAE) of power amplifiers (PAs) by smartphone original equipment manufacturers (OEMs) to increase battery life as higher data rates drive network standards. This is especially true when a much higher peak-to-average-power ratio (PAPR) signal, such as in the long term evolution (LTE) standard, is being used. It is also evident with the latest use of envelope tracking (ET) systems, which provide a modulated supply signal in synchronization with the envelope of the transmitted radio frequency (RF) signal. This can ensure that the PA stays in saturation, which is typically its most efficient operating region, for a large portion of time. This supply voltage can be varied by an ultra-high bandwidth power modulator device, which can replace a typical DC-DC converter delivering power to the RF PA. By utilizing an ET modulator in conjunction with digital pre-distortion (DPD), the overall AM-AM AM-PM characteristics can be corrected and still produce a linear output power with a relatively high efficiency. Although there are many advantages with such a system, several challenges can be introduced to the PA design including:

1. A high efficiency PA design at the saturated power can be desired and is typically a challenge. For an LTE signal, the PA may operate at only around 1.8 V root mean squared (RMS) collector voltage about 60% of the time in an ET system. It can be difficult for an RF PA to maintain a high efficiency while still meeting gain and output power specifications.

2. Some academic research work has been done which uses large scale die and board area with quarter-wave lines to improve the PAE. However, for high volume PA production, it is typically a big challenge to realize that with a low-cost, small package, a miniature MMIC, and discrete surface mount technology (SMT) components.

3. A traditional RF PA typically uses a high value bypassing capacitor, typically greater than about 1000 picofarads (pF), to stabilize the circuit at baseband frequencies. However, in order to effectively modulate the PA collector voltage, the total capacitive loading for the ET modulator may be desired to be less than about 250 pF. The low-or-no bypassing at the PA collectors can introduce a relatively high risk of oscillation and a relatively poor receiving-band noise. This can also present challenges in a multiband configuration. It is typically desired that the RF PA be insensitive to the ET modulator impedance and/or impedance of other PAs sharing the same ET modulator while maintaining a relatively low bypassing capacitance.

4. The ET system typically includes digital pre-distortion (DPD) to correct the non-linearity behavior, which allows the PA to operate with a relatively large gain expansion or switching mode to boost the PAE. However, DPD typically cannot correct a non-monotonic gain response. This can in turn lead to a desire for a high efficiency RF PA with an adequate gain response.

Some state of the art designs retune an average power tracking (APT) PA to work in an ET system. A typical PA designed for APT has an optimal performance in the linear region. When this same PA is used in an ET system, which operates in saturation, the efficiency does not typically reach its full potential. Some such designs have been deficient in PAE by more than about 5% to 10% as compared to some other competing state of the art designs. Similar topologies that have been used to increase PAE have increased real estate since a relatively large number of SMT components or transmission lines have been used to realize some such designs.

Accordingly, new PAs are disclosed herein. A Class-F RF PA with a hybrid output network including discrete SMT components, wirebonds and on-die chip capacitors has been developed. One function of this output network is to provide the correct fundamental load line and higher order harmonic terminations at the same time. By doing so, the ultimate collector voltage of a bipolar power amplifier transistor and current waveforms at the saturated power can be close to square-waves, which can significantly improve the PA efficiency.

Power amplifiers disclosed herein include termination circuits configured to provide a short circuit at one or more even harmonics and an open circuit at one or more odd harmonics. For instance, a termination circuit can provide a short circuit at a second harmonic and/or a fourth harmonic. The termination circuit can be arranged such that it also provides an open circuit at a third harmonic. In certain implementations, a termination circuit can include a series LC circuit in parallel with a capacitor. The series LC circuit can provide a short circuit at an even harmonic and provide an inductive impedance at an odd harmonic. The capacitor can provide a capacitive impedance at the odd harmonic. The capacitances and inductance of the termination circuit can be selected such that the series LC circuit and the capacitor can together provide an open circuit at the odd harmonic. In some instances, the capacitor can be included in a second series LC circuit that is in parallel with the series LC circuit.

Based on these principles, a termination circuit can present a short circuit for one or more even harmonics and present an open circuit for one or more odd harmonics. Accordingly, in an embodiment, the termination circuit can approximate presenting short circuits for all even harmonics and presenting an open circuit for all odd harmonics. Such termination circuits can be advantageous in class F power amplifiers and/or saturated power amplifiers for envelope tracking operation.

A resonant circuit can also be electrically connected to an output terminal of a power amplifier transistor. The resonant circuit can provide an open circuit for one or more odd harmonics. Accordingly, one or more odd harmonics can be open blocked for both the series and shunt directions. This can aid in achieving a desired class F operation.

Another feature of the technology described herein is terminating the harmonics at the base of a bipolar power amplifier transistor. For instance, a Class-F RF PA can have a $2^{nd}$ harmonic termination at the base of the output bipolar power amplifier transistor. Such base termination can dramatically reduce the $2^{nd}$ harmonic content and further improve PAE by about 5% or more in certain instances. Such harmonic termination at the base of the bipolar power amplifier transistor can be implemented by an on-die capacitor and a wirebond in certain embodiments.

In order to achieve the relatively high gain and relatively high output power at relatively low collector voltages, the driver of the RF PA can be deliberately selected and designed to have a relatively high gain response. By having a slight gain expansion over the output stage transistors, the overall saturated power can be increased and relatively high gain can be achieved.

A high impedance resonator or inductive choke can be disposed between an envelope tracking modulator and a collector of a bipolar power amplifier transistor. Such a circuit can present a high impedance or reactance to reduce sensitivity to a supply voltage from the envelope tracking modulator. The technology described herein can also provide insensitivity of the RF PA to different modulator impedances or other PA's load without utilizing bypass capacitors. Accordingly, bypass capacitors can be eliminated. This can be significant for the PA to operate in an ET system while making the modulator more efficient at the system level.

The technology described herein can provide a relatively simple solution to achieve an ultra-high efficiency Class-F RF PA without growing the die and/or printed circuit board (PCB area). The technology described herein can present square-wave collector waveforms with an efficiency of about 80% for low-band (e.g., about 800 MHz) and about 75% for ultra-high-band (e.g., about 2.5 GHz). Such efficiency is better than known state of the art designs and other academic work that has been realized in a larger scale of area. In certain implementations, the technology described herein does not implement any additional SMT components or surface area to be realized as compared to a typical APT PA.

The class-F amplifier disclosed herein can produce a desirable linear power in the backed-off region. This can be advantageous in that it can overcome the limitation of DPD and introduce less noise and stability concerns over a switching RF PA.

A theoretical class F PA can include several elements to realize high efficiency. The theoretical class F PA utilizes several odd order harmonic blocks, a filter to short the even order harmonics, and a relatively large choke at the collector. The technology described herein can simplify and further improve upon the classic case for large scale production. This can be implemented at least partly by blocking the 3rd harmonic and shorting the 2nd harmonic. The harmonic terminations can be strategically placed for optimal or near optimal efficiency. A second 2nd harmonic short can also be included at the input of the final stage of the PA to further improve the performance. A relatively large choking inductor from typical PA systems can be replaced by a smaller sized resonance circuit that blocks the fundamental frequency. This can reduce the loading effects of the ET modulator, which can degrade performance. The resonant circuit in place of the larger chocking inductor can also reduce loading in a multiband configuration when other band PAs are added and share the same supply pins. The technology described herein can be realized using a combination of on-die capacitors, wirebonds, SMT components, and multi-chip module (MCM) transmissions lines all in a compact package.

Figure 1A:
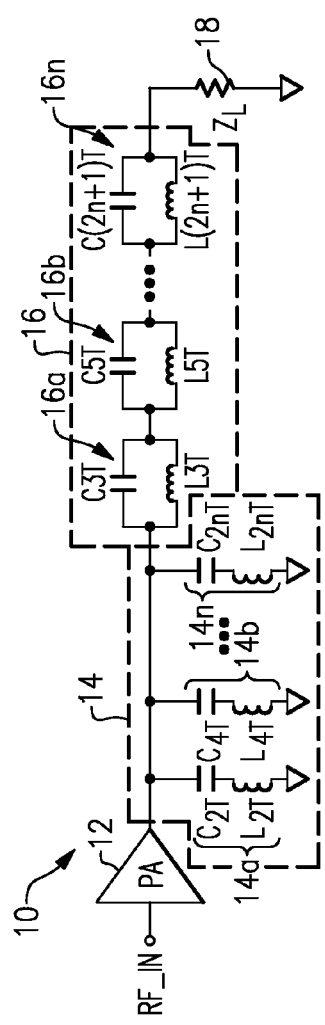
FIG. 1A is a schematic diagram of an example class-F power amplifier according to an embodiment.

FIG. 1A is a schematic diagram of an example class-F power amplifier 10 according to an embodiment. As illustrated, the class-F power amplifier 10 includes a power amplifier transistor 12, a termination circuit 14, and a resonant circuit 16. The power amplifier 10 provides an amplified RF signal to a load 18. The load 18 can be a resistive load as illustrated or any other suitable load. A class-F power amplifier can be desirable for implementing a saturated power amplifier for envelope tracking operation. A class-F amplifier can form a square wave. The power amplifier transistor 12 can receive an RF signal at an input terminal and provide an amplified RF signal at an output terminal. The termination circuit 14 can be electrically connected to the output terminal of the power amplifier transistor 12. The power amplifier transistor 12 can be a bipolar transistor or a field effect transistor, for example. In an embodiment, the power amplifier transistor can be a heterojunction bipolar transistor. The power amplifier transistor 12 can include a plurality of smaller transistors that together function as a single large transistor.

The termination circuit 14 can provide harmonic termination at even harmonics of the amplified RF signal. As illustrated, the termination circuit 14 includes a plurality of series LC circuits 14a to 14n that are each disposed between the output terminal of the power amplifier transistor 12 and a power low supply, such as ground. In FIG. 1A, the plurality of series LC circuits 14a to 14n are each configured to terminate at a phase of a different even harmonic of the amplified RF signal. For instance, a first series LC circuit 14a can terminate at a phase of a second harmonic of the amplified RF signal and a second series LC circuit 14b can terminate at a phase of a forth harmonic of the amplified RF signal. The capacitance and inductance of each series LC circuit can be selected to implement such functionality. In some other embodiments (not illustrated), any other suitable termination circuits can be implemented to provide harmonic termination for one or more even harmonics of the amplified RF signal. The termination circuit 14 can provide an open circuit at odd harmonics of the amplified RF signal, such as the third harmonic of the amplified RF signal.

The resonant circuit 16 can provide an open circuit at odd harmonics of the amplified RF signal. As illustrated, the resonant circuit 16 includes a plurality of parallel LC circuits 16a to 16n that are disposed in series between the output terminal of the power amplifier transistor 12 and the load 18. In FIG. 1A, the plurality of parallel LC circuits 16a to 16n are each configured to provide an open circuit at an odd harmonic of the amplified RF signal. For instance, a first parallel LC circuit 16a can provide an open circuit at a third harmonic of the amplified RF signal and a second parallel LC circuit 16b can provide an open circuit at a fifth harmonic of the amplified RF signal. The capacitance and inductance of each parallel LC circuit can be selected to implement such functionality. In some other embodiments (not illustrated), any other suitable resonant circuits can be implemented to provide open circuits for one or more odd harmonics of the amplified RF signal.

FIG. 1B is a schematic diagram of a portion of the termination circuit 14 of FIG. 1A. The first series LC circuit 14a can provide a short circuit at the second harmonic of the amplified RF signal. To provide such harmonic termination, the capacitance $C_{2T}$ and the inductance $L_{2T}$ of the first series LC circuit 14a can be selected in accordance with Equation 1:

$$2\omega_T = \frac{1}{\sqrt{L_{2T} * C_{2T}}} \qquad \text{(Equation 1)}$$

In Equation 1, $2\omega_T$ can represent the second harmonic of the amplified RF signal.

Similarly, for the second series LC circuit 14b to provide a short circuit at the forth harmonic of the amplified RF signal, the capacitance $C_{4T}$ and the inductance $L_{4T}$ of the second series LC circuit 14b can be selected in accordance with Equation 2:

$$4\omega_T = \frac{1}{\sqrt{L_{2T} * C_{2T}}} \qquad \text{(Equation 2)}$$

In Equation 2, $4\omega_T$ can represent the fourth harmonic of the amplified RF signal.

The parallel combination of the first series LC circuit 14a and the second series LC circuit 14b can serve to provide an open circuit at the third harmonic of the amplified RF signal. At the third harmonic, the first series LC circuit 14a can function like an inductance and the second series LC circuit 14b can function like a capacitance. Accordingly, the portion of the termination circuit 14 illustrated in FIG. 1B can function like a parallel LC circuit at the third harmonic.

The first series LC circuit 14a and the second series LC circuit 14b can together provide a third harmonic open by selecting capacitance and inductance values in accordance with Equations 3 to 5:

$$4\omega_T^2 = \frac{1}{L_{2T} * C_{2T}} \qquad \text{(Equation 3)}$$

$$16\omega_T^2 = \frac{1}{L_{4T} * C_{4T}} \qquad \text{(Equation 4)}$$

$$5 * L_{2T} = 7 * L_{4T} \qquad \text{(Equation 5)}$$

Based on the analysis of the first series LC circuit 14a and the second series LC circuit 14b illustrated in FIG. 1A, similar principles can be applied such that a combination of series LC circuits can present short circuits for two or more even harmonics and open circuits for one or more odd harmonics. Similar principles can be applied such that a combination of series LC circuits can present short circuits for two or more even harmonics and open circuits for two or more odd harmonics. Such principles and advantages can be applied in selecting capacitance and inductance values for the circuit elements of the termination circuit 14 of FIG. 1A.

Figure 2:
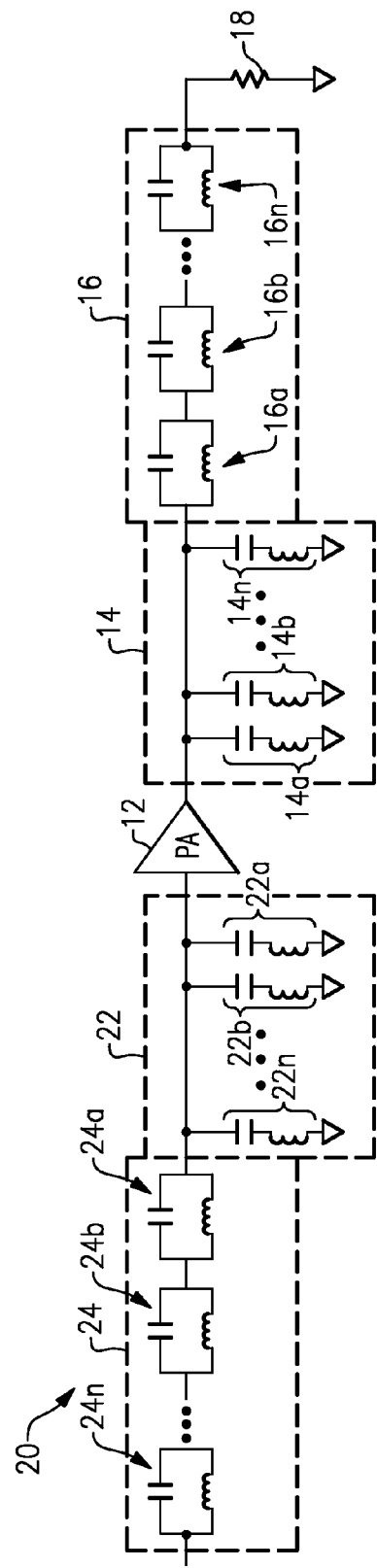
FIG. 2 is a schematic diagram of an example class-F power amplifier according to an embodiment.

FIG. 2 is a schematic diagram of an example class-F power amplifier 20 according to an embodiment. The class-F power amplifier 20 is like the class-F power amplifier 10 except that an input termination circuit 22 and an input resonant circuit 24 are also implemented. As illustrated, the class-F power amplifier 20 includes the power amplifier transistor 12, the termination circuit 14, the resonant circuit 16, the input termination circuit 22, and the input resonant circuit 24. In some embodiments, the input termination circuit 22 and the input resonant circuit 24 can be disposed between stages of the multi-stage power amplifier.

The input termination circuit 22 can provide harmonic termination at even harmonics of the RF signal. Because the amplified RF signal is an amplified version of the RF signal, these signals can have substantially the same fundamental frequency. As illustrated, the input termination circuit 22 includes a plurality of series LC circuits 22a to 22n that are each disposed between the input terminal of the power amplifier transistor 12 and a power low supply, such as ground. The input termination circuit 22 can provide harmonic termination at one or more even harmonics and/or one or more odd harmonics in a signal path to the input termination of the power amplifier transistor 12, in accordance with the principles and advantages discussed with reference to FIGS. 1A and 1B. Input termination at the input terminal of a power amplifier transistor 12 can cause PAE of the power amplifier 20 to be improved relative to the power amplifier 10.

The input resonant circuit 24 can provide an open circuit at odd harmonics of the RF signal. As illustrated, the resonant circuit 24 includes a plurality of parallel LC circuits 24a to 24n that are disposed in series between an RF input signal and the input terminal of the power amplifier transistor 12. The resonant circuit 24 can provide open circuits at one or more odd harmonics of the RF signal in the signal path to the input terminal of the power amplifier transistor 12, in accordance with the principles and advantages discussed with reference to FIGS. 1A and 1B.

Figure 3:
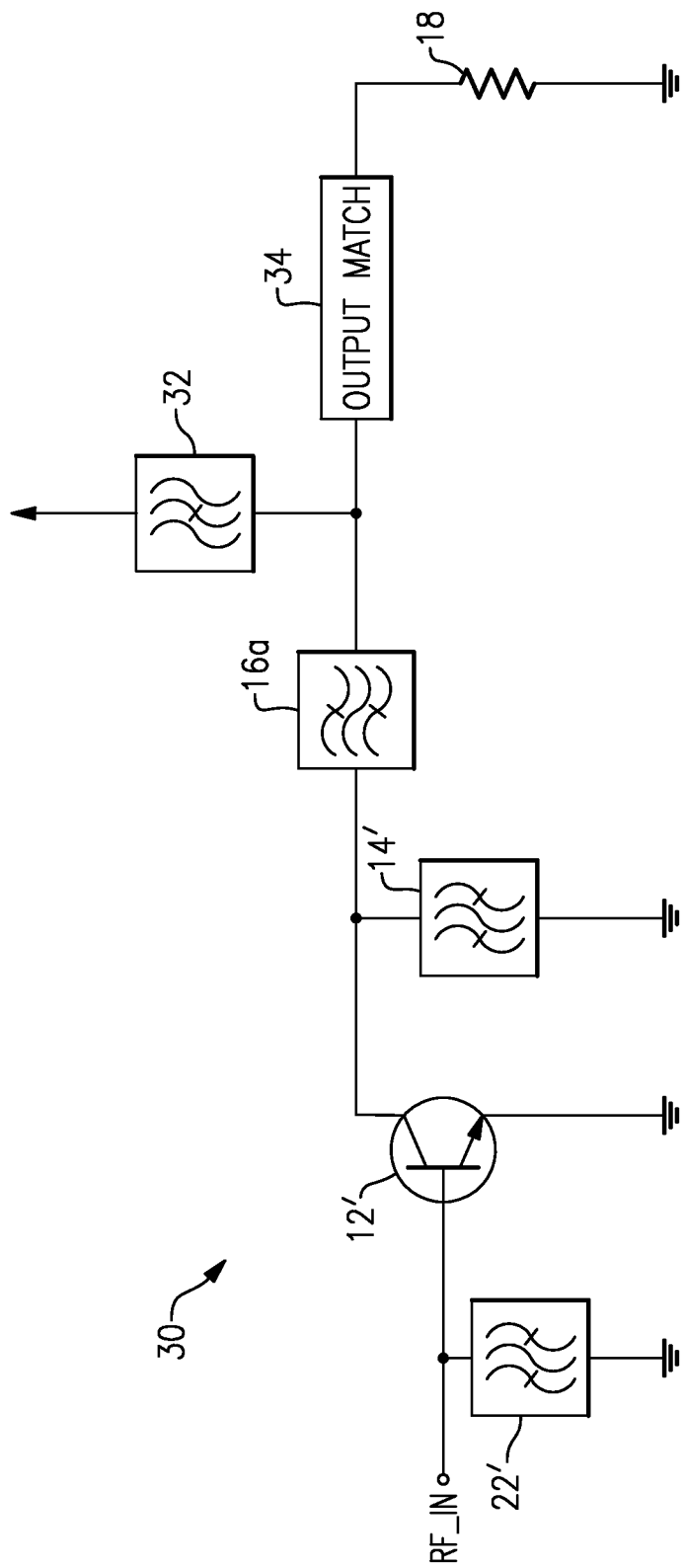
FIG. 3 is a schematic block diagram of a power amplifier according to an embodiment.

FIG. 3 is a schematic block diagram of a power amplifier 30 according to an embodiment. The power amplifier 30 can implement a third harmonic peaking class-F power amplifier. As illustrated, the power amplifier 30 includes a power amplifier transistor 12', a termination circuit 14', a resonant circuit 16a, an input termination circuit 22', a blocking circuit 32, an output match circuit 34. The power amplifier transistor 12' is an example of the power amplifier transistor 12 of FIGS. 1A, 1B, and 2. The power amplifier transistor 12' is a bipolar transistor. The bipolar power amplifier transistor 12' can have a base configured to receive an RF signal RF_IN, an emitter electrically connected to ground or any other suitable low reference voltage, and a collector configured to provide an amplified RF signal. In FIG. 3, the bipolar power amplifier transistor 12' implements the final stage of amplification of a multi-stage power amplifier, which includes one or more preceding stages.

The termination circuit 14' can be disposed between the collector of the bipolar power amplifier transistor 12' and ground. The termination circuit 14' can provide a second harmonic short circuit and a third harmonic open circuit. The resonant circuit 16a can be disposed between the collector of the bipolar power amplifier transistor 12' and the load 18. The resonant circuit 16a can provide a third harmonic open circuit.

The input termination circuit 22' can be disposed between the base of the bipolar power amplifier transistor 12' and ground. The input termination circuit 22' can provide a second harmonic short circuit. In some applications, a PAE improvement of at least 5% has been observed due to an input termination circuit configured to provide a short circuit at a second harmonic. The input termination circuit 22' can be electrically connected to a node between the bipolar power amplifier transistor 12' and a power amplifier transistor of a preceding stage of a multi-stage power amplifier in certain embodiments.

The blocking circuit 32 can be disposed between the resonant circuit 16a and the output match circuit 34. The blocking circuit 32 can block a fundamental direct current (DC) feed. The output match circuit 34 can be disposed in series between the resonant circuit 22' and the load 18. The output match circuit 34 can provide impedance matching at the fundamental frequency.

Figure 4A:
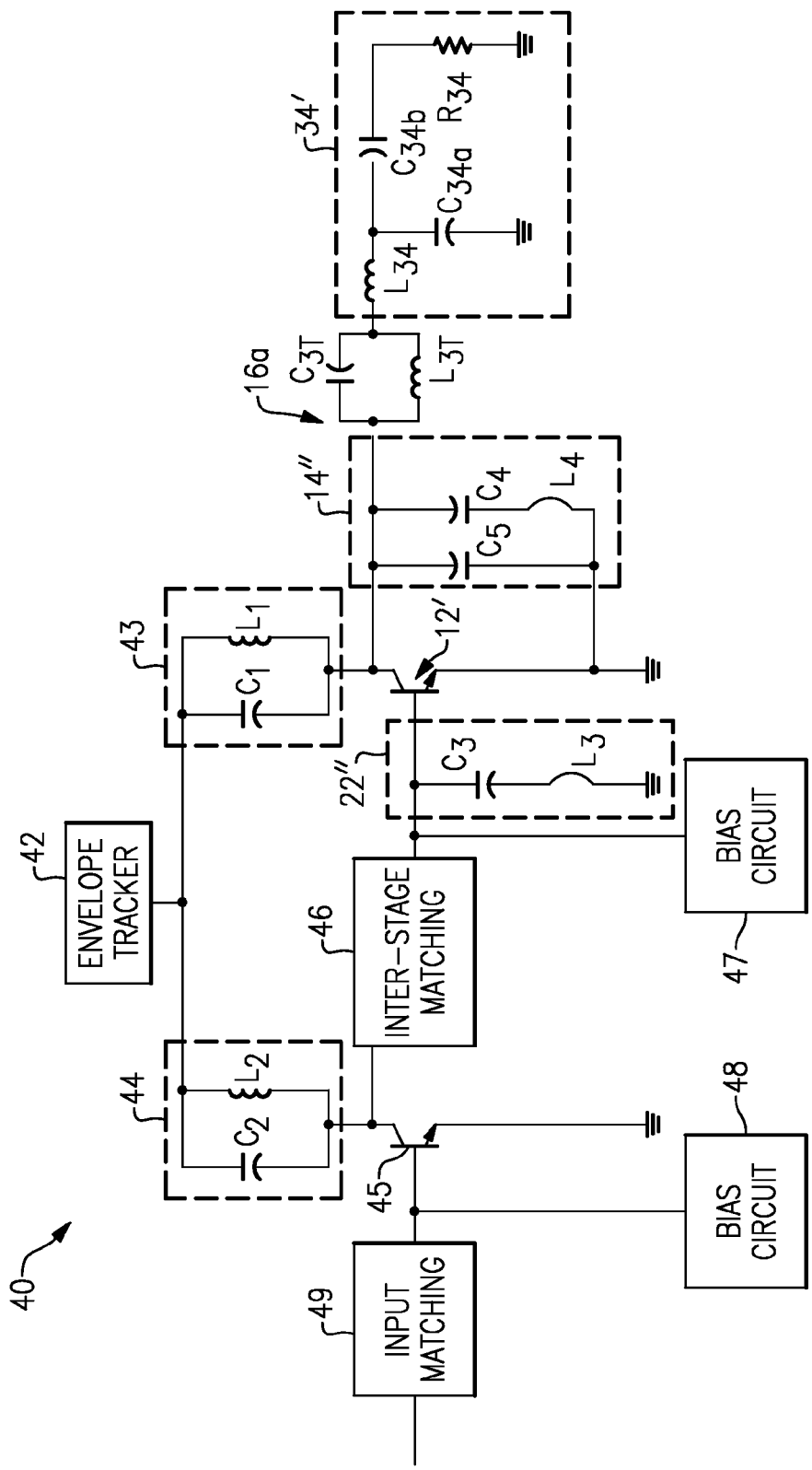
FIG. 4A is an illustrative schematic diagram of a power amplifier system according to an embodiment.

FIG. 4A is a schematic diagram of an illustrative power amplifier system 40 according to an embodiment. The power amplifier system 40 includes a multi-stage power amplifier, bias circuitry, and supply voltage circuitry. The power amplifier system 40 can provide third harmonic peaking output matching for class-F termination.

In FIG. 4A, the power amplifier system 40 includes a two-stage power amplifier. The first stage of the power amplifier includes a power amplifier transistor 45, which can be a bipolar power transistor as illustrated. The power amplifier transistor 45 can be configured to have a relatively high gain response. The power amplifier transistor 45 can have a relatively slight gain expansion compared to the power amplifier transistor 12'. This can increase the overall saturated power and achieve relatively high gain. An input matching circuit 49 can provide impedance matching and provide an RF signal to an input terminal of the power amplifier transistor 45. An inter-stage matching circuit 46 can be disposed between the power amplifier transistor 45 and the power amplifier transistor 12'. The inter-stage matching circuit 46 can provide impedance matching. An input termination circuit 22" can be electrically connected to a node in a signal path between the first stage and the second stage of the power amplifier. For instance, the input termination circuit 22" can be electrically connected to a node between the inter-stage matching circuit 46 and the input terminal of the power amplifier transistor 12' as illustrated. The input termination circuit 22" can be electrically connected to a node between the bias circuit 47 and the input terminal of the power amplifier transistor 12'. When the power amplifier transistor 12' is a bipolar transistor, the input termination circuit 22" can be electrically connected to the base of the bipolar power amplifier transistor.

The input termination circuit 22" can provide a short circuit at a second harmonic of the RF signal provided to the input terminal of the power amplifier transistor 12'. As illustrated in FIG. 4A, the input termination circuit 22" can include a series LC circuit. The series LC circuit can include a capacitor $C_3$ in series with an inductive element $L_3$. The capacitor $C_3$ can be embodied on a power amplifier die that includes the power amplifier transistor 12'. The inductive element $L_3$ can be implemented external to the power amplifier die. For instance, the inductive element $L_3$ can be implemented by one or more wirebonds, as indicated by the symbol used to illustrate the inductive element $L_3$ in FIG. 4A. As one example, the inductive element $L_3$ can be implemented by three wirebonds in parallel. Implementing the inductive element $L_3$ with a different number of wirebonds in parallel can adjust the inductance of the inductive element $L_3$. According to some other embodiments, the inductive element $L_3$ can be implemented by one or more spiral inductors external to the power amplifier die. The capacitance of the capacitor $C_3$ the inductance of the inductive element $L_3$ can be selected such that the termination circuit 22" provides a short circuit at the second harmonic.

The second stage of the power amplifier includes the power amplifier transistor 12' and an output matching network that includes a termination circuit 14", a resonant circuit 16a, and an output matching circuit 34'. The power amplifier transistor 12' can receive an RF signal from the first stage of the power amplifier 40 and provide an amplified RF signal.

The termination circuit 14" can provide a short circuit at a second harmonic of the amplified RF signal and an open circuit at a third harmonic of the amplified RF signal. As illustrated in FIG. 4A, the termination circuit 14" can include a series LC circuit in parallel with a capacitor. The series LC circuit can include a capacitor $C_4$ in series with an inductive element $L_4$. The capacitor $C_4$ can be embodied on a power amplifier die that includes the power amplifier transistor 12'. The inductive element $L_4$ can be implemented external to the power amplifier die. For instance, the inductive element $L_4$ can be implemented by one or more wirebonds, as indicated by the symbol used to illustrate the inductive element $L_4$ in FIG. 4A. As one example, the inductive element $L_4$ can be implemented by four wirebonds in parallel. According to some other embodiments, the inductive element $L_4$ can be implemented by one or more spiral inductors external to the power amplifier die.

The capacitance of the capacitors $C_4$ and $C_5$ and the inductance of the inductive element $L_4$ can be selected such that the termination circuit 14" provides a short circuit at the second harmonic. As discussed above with reference to FIG. 1B, the series LC circuit that includes the capacitor $C_4$ and the inductive element $L_4$ can function as an inductive impedance at a third harmonic. A capacitor $C_5$ can be arranged in parallel with the series LC circuit to provide a capacitance that together with the series LC circuit can provide an open circuit at the third harmonic. The capacitance of the capacitor $C_5$ can be selected such that its impedance at the third harmonic of the amplified RF signal together with the impedance of the series LC circuit of the termination circuit 14" provides an open circuit at the third harmonic. The capacitor $C_5$ can be implemented on the power amplifier die in certain embodiments.

The resonant circuit 16a can include a parallel LC circuit configured to provide an open circuit at the third harmonic and an impedance match at the fundamental frequency of the amplified RF signal. The capacitance of the capacitor $C_{3T}$ and the inductance of the inductive element $L_{3T}$ can be selected so as to achieve this functionality. The output match circuit 34 can provide impedance matching for the output of the power amplifier. As illustrated, the output match circuit 34 includes an inductor $L_{34}$, capacitors $C_{34A}$ and $C_{34B}$, and resistor $R_{34}$.

The power amplifier system 40 includes a supply voltage circuit for providing a supply voltage to the power amplifier. The supply voltage circuit of FIG. 4A includes an envelope tracking modulator 42 and resonant circuits 43 and 44. The envelope tracking modulator 42 can provide a supply voltage that tracks an envelope of the amplified RF signal provided as an output of the power amplifier. Such a supply voltage can keep the power amplifier in saturation, which can be its most efficient operating region for certain applications, for a relatively large portion of time. The envelope tracking modulator can include an ultra-high bandwidth power modulator device in certain implementations.

The envelope tracking modulator 42 can provide the supply voltage to the power amplifier transistor 12' by way of a first resonant circuit 43. As illustrated, the first resonant circuit 43 includes a capacitor $C_1$ and an inductor $L_1$ arranged in a first parallel LC circuit. The inductor $L_1$ can aid in biasing the power amplifier transistor 12' the supply voltage generated by the envelope tracking modulator 42. As illustrated, the inductor $L_1$ includes a first end electrically connected to the envelope tracking modulator 42, and a second end electrically connected to the collector of the bipolar power amplifier transistor 12'. The resonant circuit 43 can provide isolation between the envelope tracking modulator 42 and the collector of the power amplifier transistor 12'. Having the resonant circuit 43 disposed between the envelope tracking modulator 42 and the collector can prevent an RF signal from generating noise on the envelope tracking modulator 42, which can feedback to the power amplifier transistor 12'.

The resonant circuit 43 can provide high impedance isolation. For instance, by configuring the inductor $L_1$ and the capacitor $C_1$ to resonate at or near the fundamental frequency, the impedance of the parallel LC circuit can be relatively high at the fundamental frequency of the amplified RF signal. High impedance isolation of the resonant circuit 43 can prevent the collector of a bipolar power amplifier transistor from being significantly impacted by the loading of the envelope tracking modulator 42. With the resonant circuit 43, a bypass capacitor can be eliminated.

The envelope tracking modulator 42 can provide the supply voltage to a power amplifier transistor 45 of the first stage of the power amplifier by way of a second resonant circuit 44. As illustrated, the second resonant circuit 44 includes a capacitor $C_2$ and an inductor $L_2$ arranged in a second parallel LC circuit. The second resonant circuit 43 can resonate at or near the signal frequency of the amplified RF signal so as to provide isolation between the power amplifier transistors 45 and 12'. The second resonant circuit 44 can decrease capacitive loading of the envelope tracking modulator 42 relative to using a bypass capacitor.

Providing the first and second resonant circuits 43 and 44 for can aid in reducing capacitive loading of the envelope tracking modulator 42 in implementations in which it is desired to have both the first stage of the power amplifier and the second stage of the power amplifier operate on a common supply voltage generated by the envelope tracking modulator 42. According to some other implementations (not illustrated), a resonant circuit can be provided between an envelope tracking modulator and one stage of a multi-stage power amplifier.

The power amplifier system 40 also includes a first stage bias circuit 48 and a second stage bias circuit 47. The first stage bias circuit 48 can provide a suitable bias signal to the input terminal of the power amplifier transistor 45 so as to enable and disable the power amplifier 45 as desired. The second stage bias circuit 47 can provide a suitable bias signal to the input terminal of the power amplifier transistor 12' so as to enable and disable the power amplifier 12' as desired.

Figure 4B:
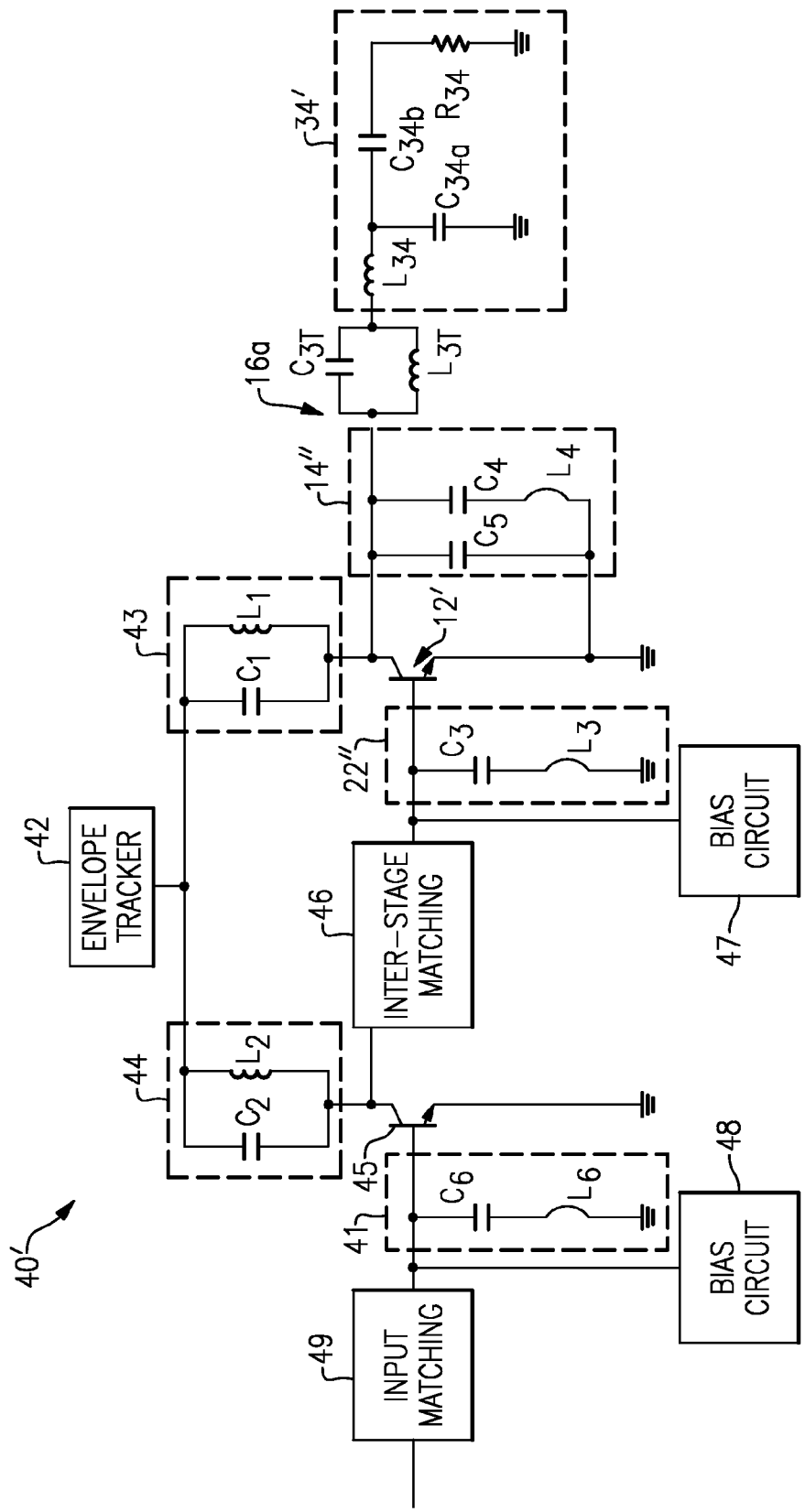
FIG. 4B is an illustrative schematic diagram of a power amplifier system according to an embodiment.

FIG. 4B is a schematic diagram of an illustrative power amplifier system 40' according to an embodiment. The power amplifier system 40' is similar to the power amplifier system 40 of FIG. 4A except the power amplifier system 40' additionally includes an input stage termination circuit 41. The input termination circuit 41 can provide harmonic termination at an input terminal of the power amplifier transistor 45. As illustrated, the input stage termination circuit 41 can be electrically connected to a node between the bias circuit 48 and the input terminal of the power amplifier transistor 45.

The input state termination circuit 41 can provide a short circuit at a second harmonic of the RF signal provided to the input terminal of the power amplifier transistor 45. As illustrated in FIG. 4B, the input stage termination circuit 41 can include a series LC circuit. The series LC circuit can include a capacitor $C_6$ in series with an inductive element $L_6$. The capacitor $C_6$ can be embodied on a power amplifier die that includes the power amplifier transistor 45 and/or power amplifier transistor 12'. The inductive element $L_6$ can be implemented external to the power amplifier die. For instance, the inductive element $L_6$ can be implemented by one or more wirebonds, as indicated by the symbol used to illustrate the inductive element $L_6$ in FIG. 4B. In some instances, the inductive element $L_6$ can be implemented by two or more wirebonds in parallel. Implementing the inductive element $L_6$ with a different number of wirebonds in parallel can adjust the inductance of the inductive element $L_6$. According to some other implementations, the inductive element $L_6$ can be implemented by one or more spiral inductors external to the power amplifier die. The capacitance of the capacitor $C_6$ the inductance of the inductive element $L_6$ can be selected such that the input stage termination circuit 41 provides a short circuit at the second harmonic.

Figure 5:
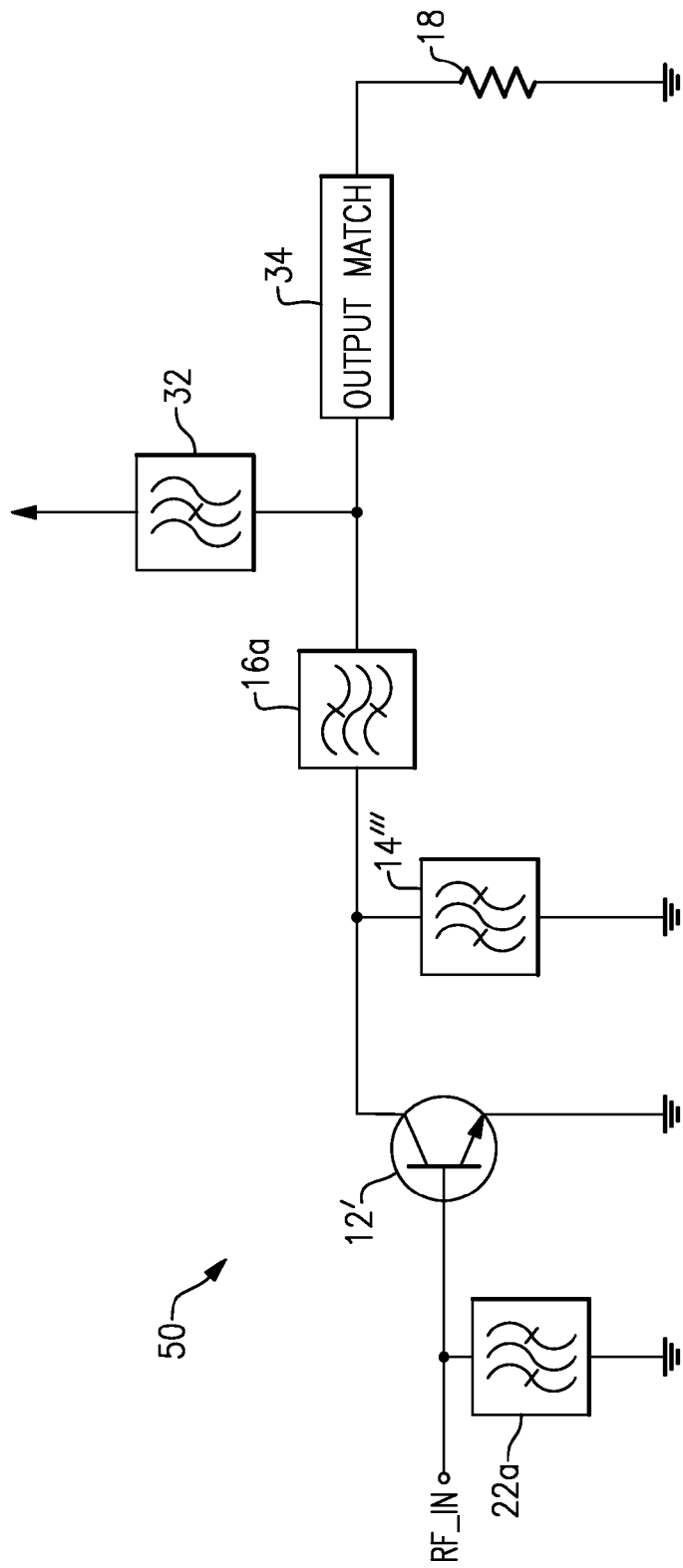
FIG. 5 is a schematic block diagram of a power amplifier according to an embodiment.

FIG. 5 is a schematic block diagram of a power amplifier 50 according to an embodiment. The power amplifier 50 is similar to the power amplifier 30 of FIG. 3 except these power amplifiers have different termination circuits 14' and 14''', respectively. The termination circuit 14''' is configured to provide a short circuit at a second harmonic of the amplified RF signal, a short circuit at a forth harmonic of the amplified RF signal, and an open circuit at a third harmonic of the amplified RF signal. The power amplifier 50 can implement a third harmonic peaking with second and forth harmonic shorting class-F power amplifier.

Figure 6:
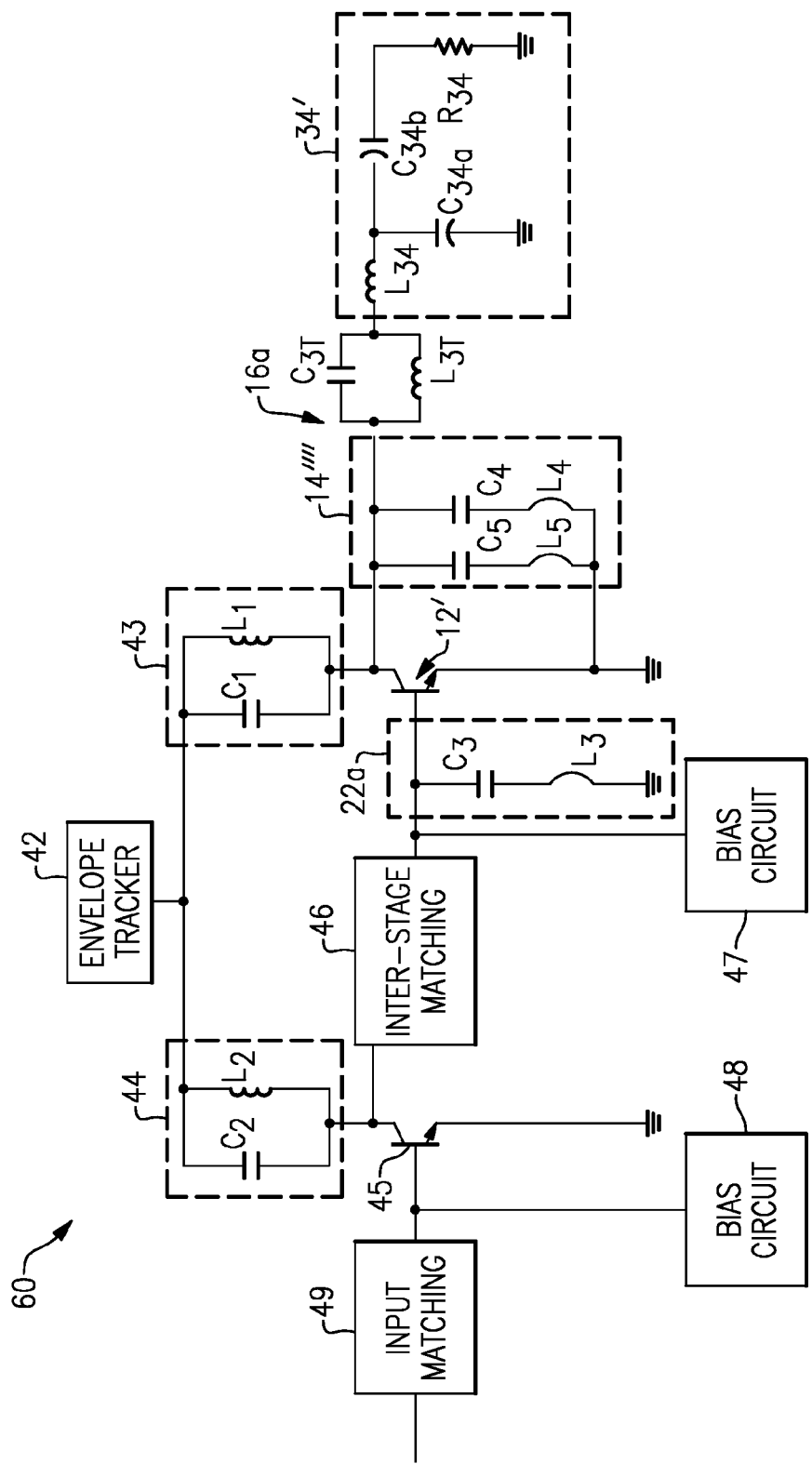
FIG. 6 is an illustrative schematic diagram of power amplifier system according to an embodiment.

FIG. 6 is a schematic diagram of an illustrative power amplifier system 60 according to an embodiment. The power amplifier system 60 is similar to the power amplifier system 50 of FIG. 5 except these power amplifiers have different termination circuits 14" and 14"", respectively. The power amplifier system 60 can implement a third harmonic peaking with second and forth harmonic shorting class-F power amplifier.

The termination circuit 14"" can provide a short circuit at a second harmonic of the amplified RF signal, a short circuit at a forth harmonic of the amplified RF signal, and an open circuit at a third harmonic of the amplified RF signal. Like the termination circuit 14" of FIG. 4A, the capacitor $C_5$ is in parallel with a series LC circuit that includes the capacitor $C_4$ and the inductive element $L_4$. In FIG. 6, the termination circuit 14"" includes an inductive element $L_5$ in series with the capacitor $C_5$ such that the termination circuit 14"" can provide a short circuit at the fourth harmonic of the amplified RF signal.

As illustrated in FIG. 6, the termination circuit 14"" includes a first series LC circuit in parallel with a second series LC circuit. The first series LC circuit can include a capacitor $C_4$ in series with an inductive element $L_4$. The second series LC circuit can include a capacitor $C_5$ in series with an inductive element $L_5$. The capacitors $C_4$ and $C_5$ can be embodied on a power amplifier die that includes the power amplifier transistor 12'. The inductive elements $L_4$ and/or $L_5$ can be implemented external to the power amplifier die. For instance, the inductive elements $L_4$ and $L_5$ can each be implemented by one or more wirebonds, as indicated by the symbol used to illustrate these inductive elements in FIG. 6. The inductive elements $L_4$ and $L_5$ can be implemented by different numbers of wirebonds such that they have different inductances. As one example, the inductive element $L_4$ can be implemented by four wirebonds in parallel and the inductive element $L_5$ can be implemented by a five wirebonds in parallel. According to some other embodiments, the inductive elements $L_4$ and/or $L_5$ can be implemented by one or more spiral inductors external to the power amplifier die. The capacitance of the capacitors $C_4$ and $C_5$ and the inductance of the inductive elements $L_4$ and $L_5$ can be selected in accordance with the principles and advantages discussed with reference to FIG. 1B, for example.

Figure 7:
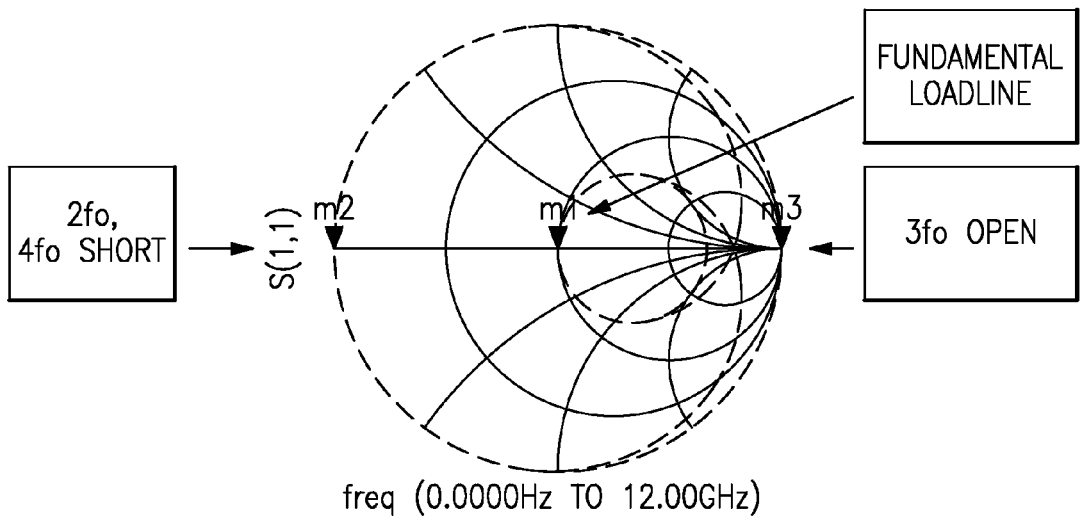
FIG. 7 is a Smith chart corresponding to an embodiment of FIG. 6.

FIG. 7 is a Smith chart corresponding to an embodiment of FIG. 6. In FIG. 7, the amplified RF signal provided by a power amplifier system has a fundamental frequency of approximately 2.54 Gigahertz (GHz). As shown in FIG. 7, the power amplifier system provides an open circuit at a third harmonic (approximately 7.62 GHz) and a short circuit at the second and forth harmonics (approximately 5.06 GHz and approximately 10.14 GHz, respectively).

Figure 8:
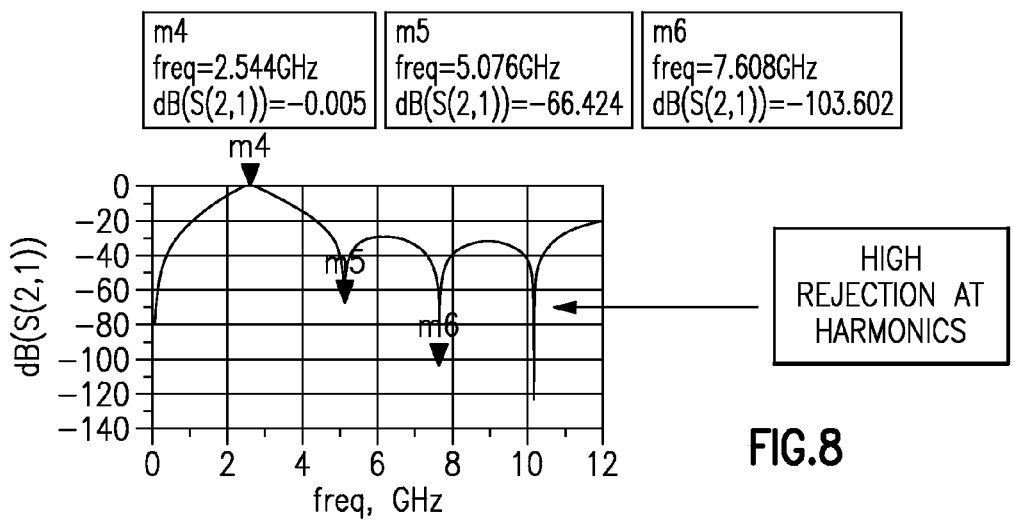
FIG. 8 is a graph illustrating harmonic rejection over frequency corresponding to an embodiment of FIG. 6.

FIG. 8 is a graph illustrating harmonic rejection over frequency corresponding to an embodiment of FIG. 6. In FIG. 8, the amplified RF signal provided by a power amplifier system has a fundamental frequency of approximately 2.54 Gigahertz (GHz). As shown in FIG. 8, the power amplifier system provides relatively high harmonic rejection at harmonics of the fundamental frequency. In the illustrated graph, the frequency response of the power amplifier output has local minima around the second, third, and fourth harmonics of the fundamental frequency. As also shown in FIG. 8, higher harmonic rejection can be provided at higher harmonics of the fundamental frequency.

Figure 9:
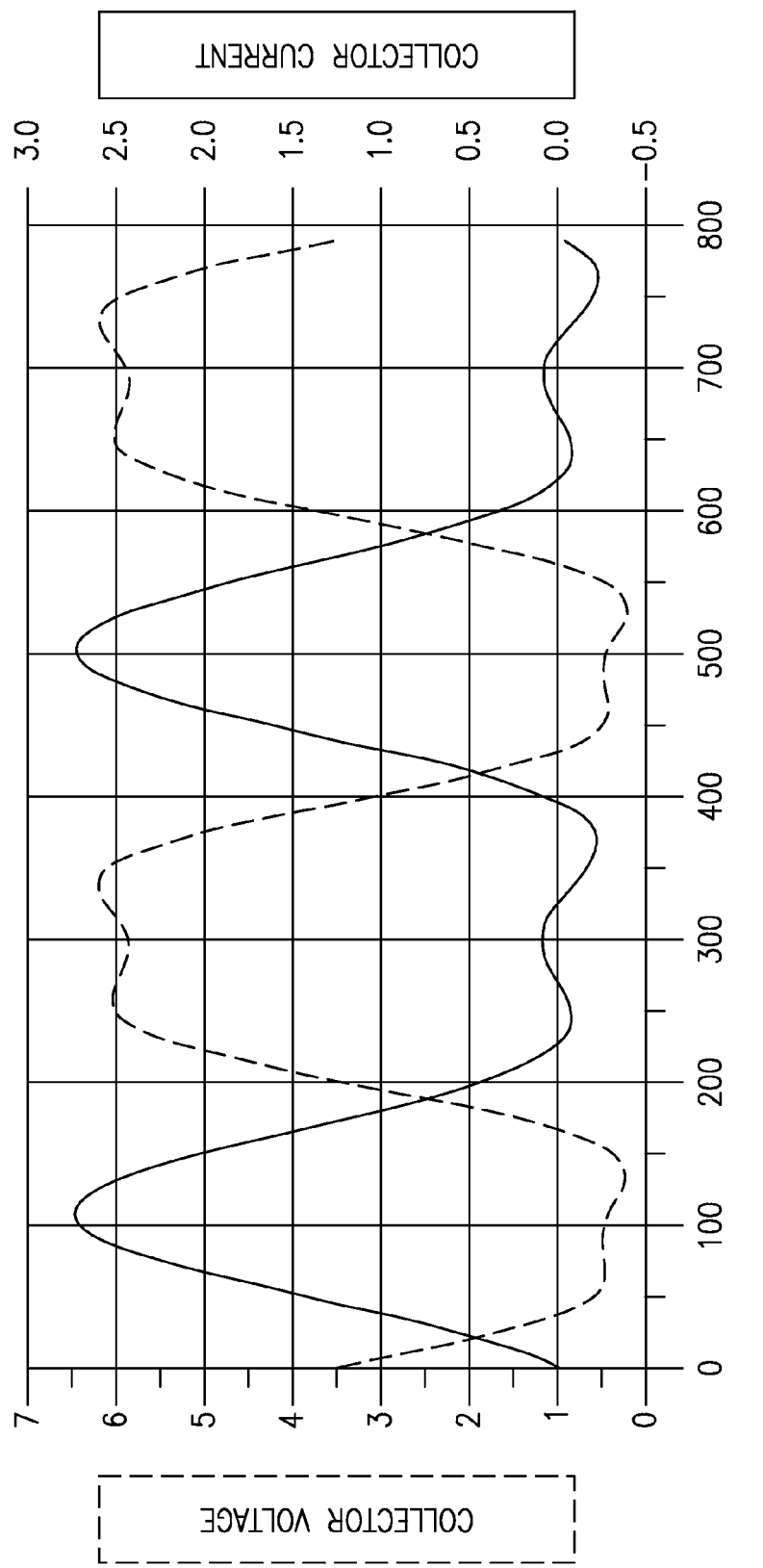
FIG. 9 shows graphs of collector voltage and collector current over time corresponding to an embodiment.

FIG. 9 shows graphs of collector voltage and collector current over time corresponding to an embodiment. As shown in FIG. 9, the collector voltage is relatively close to a square-wave at saturation. Accordingly, the power amplifiers discussed herein can function as efficient class-F power amplifiers.

Figure 10:
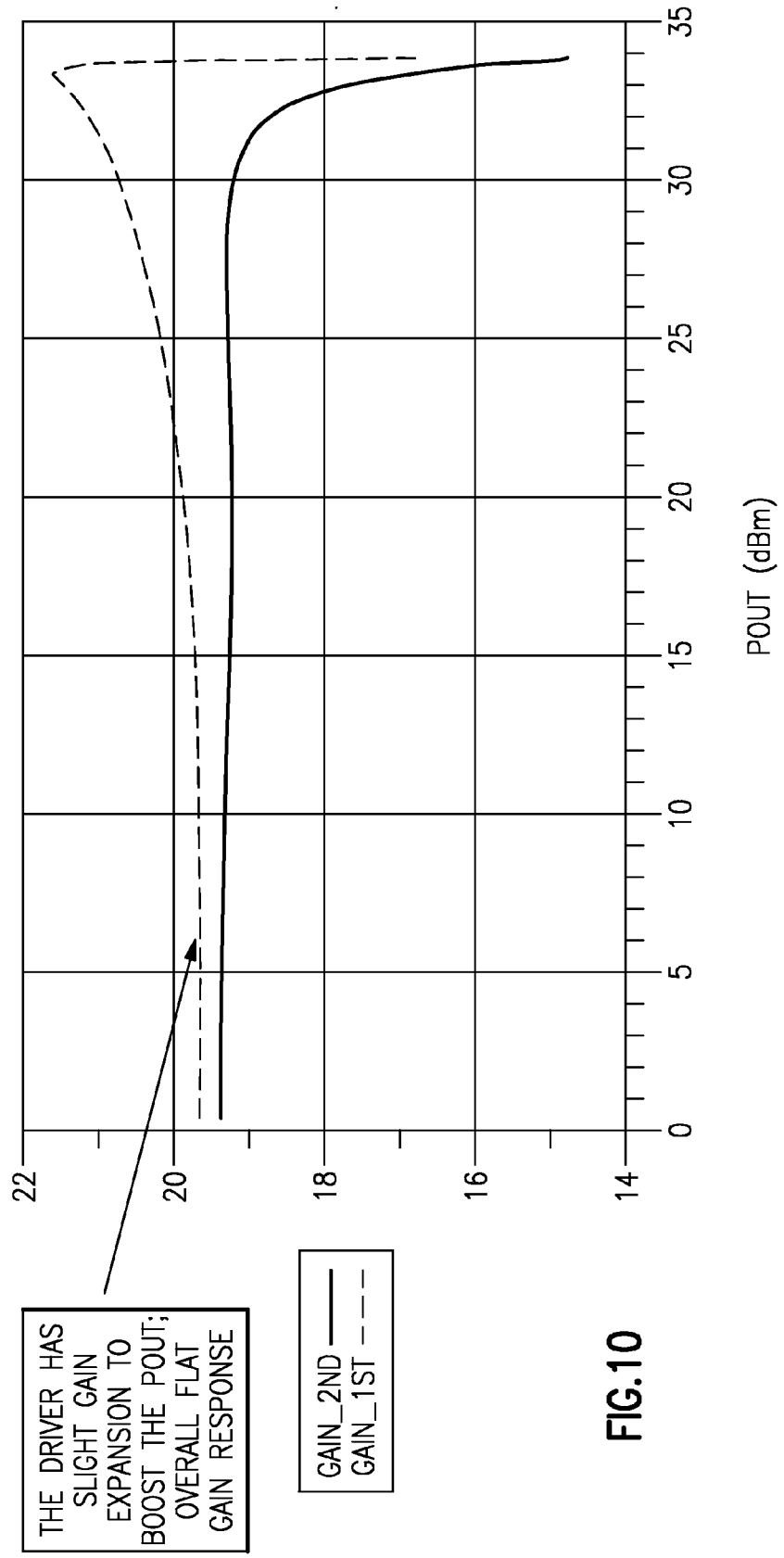
FIG. 10 is a graph with curves for gain of two power amplifier stages as a function of output power corresponding to an embodiment.

FIG. 10 is graphs with curves for gain of two power amplifier stages as a function of output power corresponding to an embodiment. The first stage can correspond to the power amplifier transistor 45 of FIG. 6 and the second power amplifier stage can correspond to the power amplifier transistor 12' of FIG. 6. In order to efficiently achieve a relatively high gain and a relatively high output power at relatively low collector voltages, a first stage of a power amplifier can be configured to have a relatively high gain response. By having a relatively slight gain expansion over a subsequent stage of the power amplifier, the overall saturated power can be increased and a relatively high gain can be achieved. As shown in FIG. 10, the first stage of a power amplifier can have a relatively slight gain expansion to boost output power. Such a gain expansion can be implemented, for example, for the power amplifier transistor 45 of FIGS. 4 and/or 6. This can create a relatively flat gain response of the overall power amplifier system.

Simulation results and experimental measurements indicate the power amplifiers implemented in accordance with the principles and advantages discussed herein can operate at high collector efficiencies (for example, high PAE) for different frequency bands of an amplified RF signal. Moreover, experimental results indicate that power amplifiers implemented in accordance with the principles and advantages discussed herein can achieve relatively flat gain responses over a range of collector voltages (for example, collector voltages from about 0.8 V to about 3.6 V) for different frequency bands of an amplified RF signal.

The principles and advantages discussed herein can be implemented in a power amplifier module. FIGS. 11A to 13B illustrated six illustrative power amplifier modules. These power amplifier modules can implement any combination of features of the power amplifiers and/or supply voltage circuits discussed herein. A power amplifier module can implement any suitable combination of features discussed with reference to any of FIGS. 11A to 13B and/or any suitable subset thereof. The illustrative power amplifier modules can include various electronic components enclosed within a single package. The package can encase a power amplifier die, another die, passive circuit elements, the like, or any combination thereof. As one example, a power amplifier module can include a power amplifier die and one or more other dies. The one or more other dies can implement control circuitry, one or more RF switches, one or more filters, one or more duplexers, or any combination thereof. In an embodiment, the power amplifier die can be a GaAs die and another die within the same package of the power amplifier module can include a silicon die. Passive circuit elements, such as inductive circuit elements, can be implemented external to the power amplifier die and within a power amplifier module. For instance, within a power amplifier module, wirebonds electrically connected to the power amplifier die can implement inductive elements of any of the termination circuits discussed herein. As another example, inductive elements of any of the resonant circuits discussed herein can be implemented external to the power amplifier die. Such inductive elements can be implemented, for example, by spiral inductors and/or wirebonds.

Figure 11A:
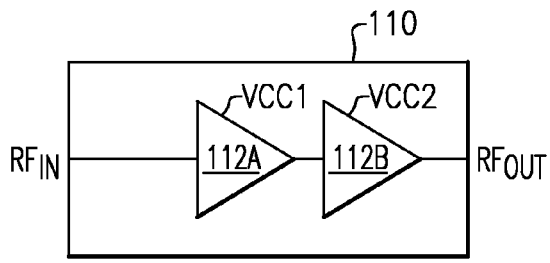
FIG. 11A is a block diagram of a power amplifier module according to an embodiment.

FIG. 11A is a block diagram of an illustrative power amplifier module 110 according to an embodiment. As illustrated, the power amplifier module 110 includes a power amplifier that includes a first stage 112A and a second stage 112B. While two power amplifier stages are illustrated in FIG. 11A, it will be understood that any of the power amplifiers discussed herein can be implemented with any suitable number of stages. The power amplifier can provide an amplified version of an RF input signal $RF_{IN}$ as an RF output signal $RF_{OUT}$. The first stage 112A and the second stage 112B can receive different power supply voltages $V_{CC1}$ and $V_{CC2}$, respectively, in certain implementations. A power supply circuit to supply such power supply voltages can be implemented as part of the power amplifier module 110 or external to the power amplifier module 110. Such a power supply circuit can implement any suitable combination of features of the supply circuits, such as the envelope tracking modulator 42 and/or the resonant circuits 43 and/or 44 discussed with reference to FIGS. 4A, 4B, and/or 6. The power amplifier of the power amplifier module 110 can implement any combination of features discussed with reference to power amplifiers discussed herein, such as harmonic termination circuits and/or resonant circuits discussed with reference to any of FIGS. 1A to 10. This power amplifier can be a class F power amplifier.

Figure 11B:
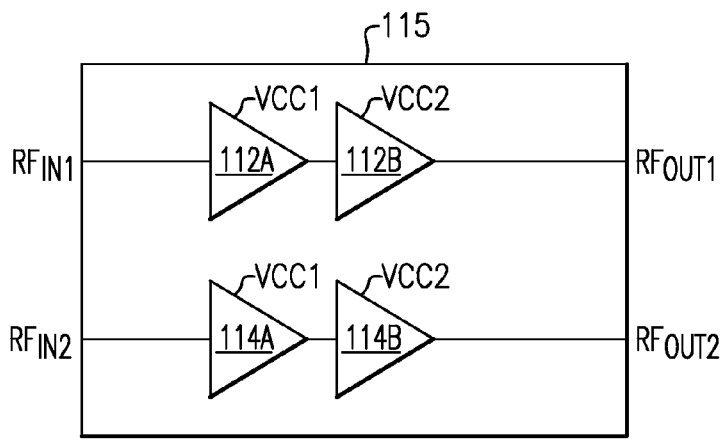
FIG. 11B is a block diagram of a power amplifier module according to an embodiment.

FIG. 11B is a block diagram of an illustrative power amplifier module 115 according to an embodiment. The power amplifier module 115 includes a plurality of power amplifiers. In the power amplifier module 115, a first power amplifier includes stages 112A and 112B and a second power amplifier includes stages 114A and 114B. The first power amplifier and/or the second power amplifier can implement any combination of features discussed with reference to power amplifiers discussed herein, such as harmonic termination circuits and/or resonant circuits discussed with reference to any of FIGS. 1A to 10. Accordingly, the first power amplifier and/or the second power amplifier can implement efficient class-F amplifiers, among other features.

The power amplifier module 115 can be a multi-band and/or a multi-mode power amplifier module. The first power amplifier and the second power amplifier can be configured to amplify RF signals that are within different frequency bands and/or can operate in different modes of operation, such as in different power modes. For instance, the first power amplifier can amplify a first RF signal $RF_{IN1}$ having a center frequency within a first frequency band and the second power amplifier can amplify a second RF signal $RF_{IN2}$ having a center frequency within a second frequency band. The first power amplifier can provide an amplified version of the first RF signal $RF_{IN1}$ as a first RF output signal $RF_{OUT1}$. The second power amplifier can provide an amplified version of the second RF signal $RF_{IN2}$ as a second RF output signal $RF_{OUT2}$. While the power amplifier module 115 illustrates two power amplifiers, it will be understood that three or more power amplifiers can be implemented in a power amplifier module in certain embodiments.

Figure 12A:
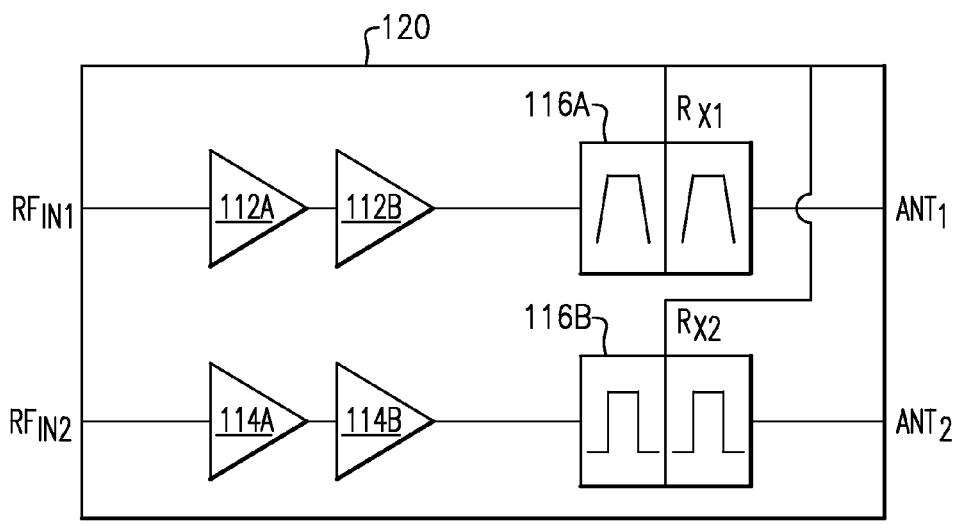
FIG. 12A is a block diagram of a power amplifier module according to an embodiment.

Power amplifier modules can include duplexers in some embodiments. FIG. 12A is a block diagram of an illustrative power amplifier module 120 according to an embodiment. As illustrated, the power amplifier module 120 includes a first power amplifier, a second power amplifier, a first duplexer 116A, and a second duplexer 116B. In FIG. 12A, the first power amplifier includes a first stage 112A and a second stage 112B and the second power amplifier includes a first stage 114A and a second stage 114B. These power amplifiers can implement any suitable combination of features of the power amplifiers of FIG. 11B.

The power amplifier module 120 includes duplexers 116A and 116B disposed between power amplifiers and antenna ports and also disposed between antenna ports and receive ports. The first duplexer 116A can filter a first amplified RF signal from the first power amplifier and provide the filtered first RF signal to a first antenna port ANT1. The first duplexer can provide filtering for a particular frequency band associated with the first antenna port ANT1. The first duplexer 116A can filter a first received RF signal from the first antenna port ANT1 and provide the filtered first received RF signal to a first receive port RX1. The second duplexer 116B can filter a second amplified RF signal from the second power amplifier and provide the filtered second RF signal to a second antenna port ANT2. The second duplexer can provide filtering for a particular frequency band associated with the second antenna port ANT2. The second duplexer 116B can filter a second received RF signal from the second antenna port ANT2 and provide the filtered second received RF signal to a second receive port RX2.

Figure 12B:
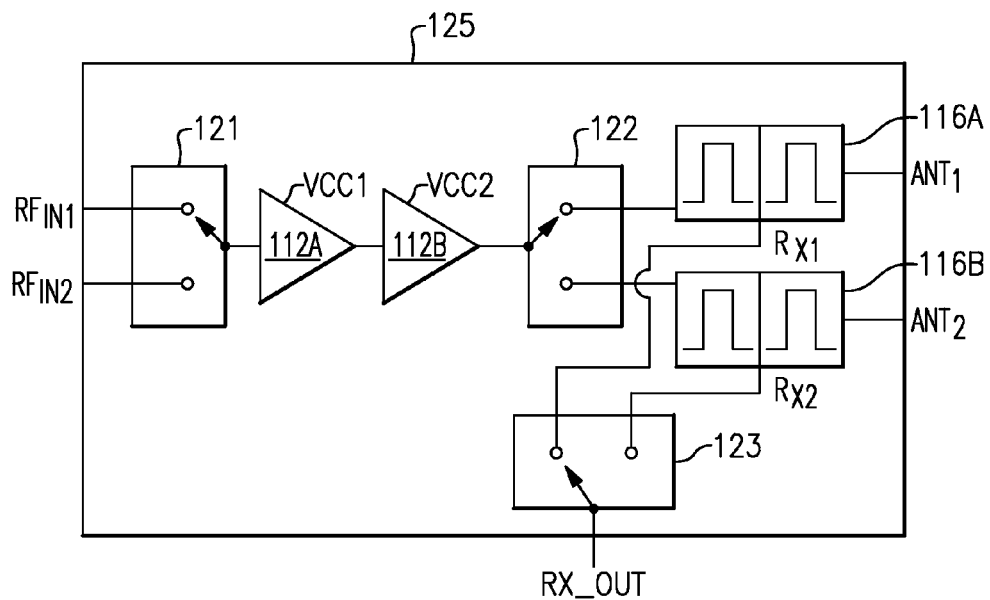
FIG. 12B is a block diagram of a power amplifier module according to an embodiment.

FIG. 12B is a block diagram of an illustrative power amplifier module 125 according to an embodiment. The power amplifier module 125 can implement a broadband power amplifier with duplexers. As illustrated, the power amplifier module 125 includes a power amplifier, a first duplexer 116A, a second duplexer 116B, an RF input switch 121, an RF output switch 122, and an RF receive switch 123. In certain embodiments, the power amplifier module 125 can include a switch control circuit (not illustrated) to control the states of one or more of the RF input switch 121, the RF output switch 122, and the RF receive switch 123. Compared to the power amplifier module 120, the power amplifier module 125 includes RF switches 121, 122, and 123 and one less power amplifier. The RF switches 121, 122, and 123 can be single pole double throw switches as illustrated.

The RF input switch 121 can selectively provide an RF input signal $RF_{IN1}$ or $RF_{IN2}$ to the first stage 112A of the power amplifier. The RF input signal provided to the first stage 112A can be associated with a selected frequency band, for example. The amplified RF signal provided by the power amplifier can be provided to the output RF switch 122. The output RF switch can selectively provide the amplified RF signal from the power amplifier to a particular duplexer 116A or 116B. The duplexer 116A or 116B that receives the amplified RF signal from the power amplifier can filter the amplified RF signal and provide the filtered RF signal to a respective antenna port ANT1 or ANT2. The duplexers 116A and 116B can provide filtering for a different frequency band associated with a particular antenna port. The RF receive switch 123 can provide a selected RF signal from an antenna port ANT1 or ANT2 to a receive port RX_OUT. The selected RF signal can be filtered by a respective duplexer 116A or 116B.

Figure 13A:
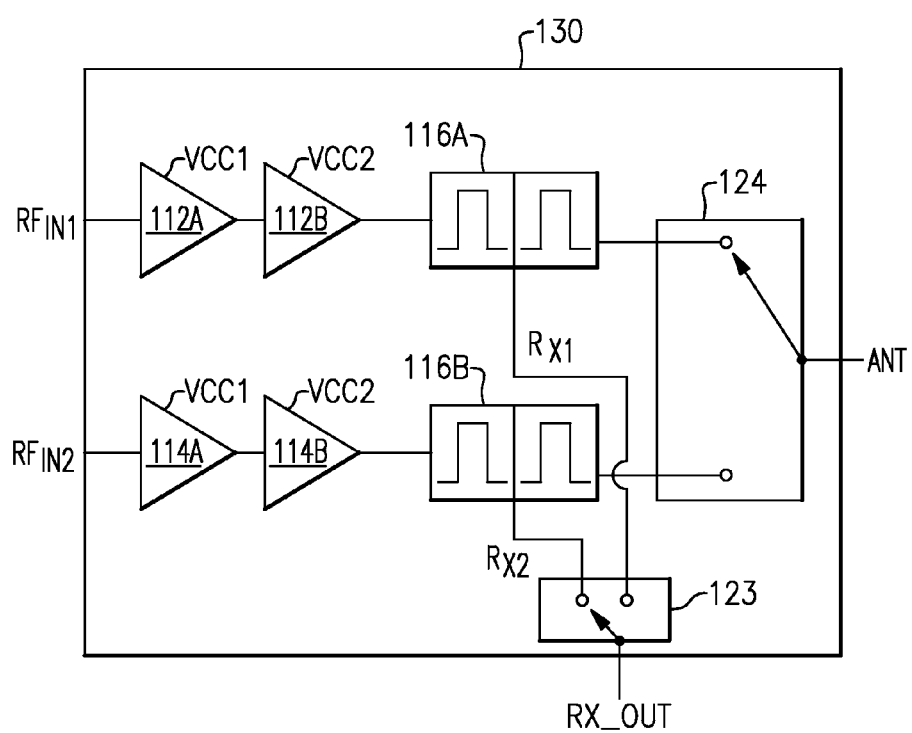
FIG. 13A is a block diagram of a power amplifier module according to an embodiment.

FIG. 13A is a block diagram of an illustrative power amplifier module 130 according to an embodiment. The power amplifier module 130 can implement a power amplifier with duplexers and an antenna switch circuit. As illustrated, the power amplifier module 130 includes a first power amplifier, a second power amplifier, a first duplexer 116A, a second duplexer 116B, an RF receive switch 123, and an antenna switch circuit 124. Compared to the power amplifier module 125, the power amplifier module 130 includes the antenna switch circuit 124 and an additional power amplifier, but does not include the RF input switch 121 or the RF output switch 122 of FIG. 12B. The antenna switch circuit 124 can selectively electrically couple a particular RF path of a plurality of different RF signal paths to an antenna port ANT. For instance, in FIG. 13B, the antenna switch circuit 124 can selectively electrically couple a first RF signal path associated with a first power amplifier to an antenna port ANT or selectively electrically couple a second RF signal path associated with a second power amplifier to the antenna port ANT.

Figure 13B:
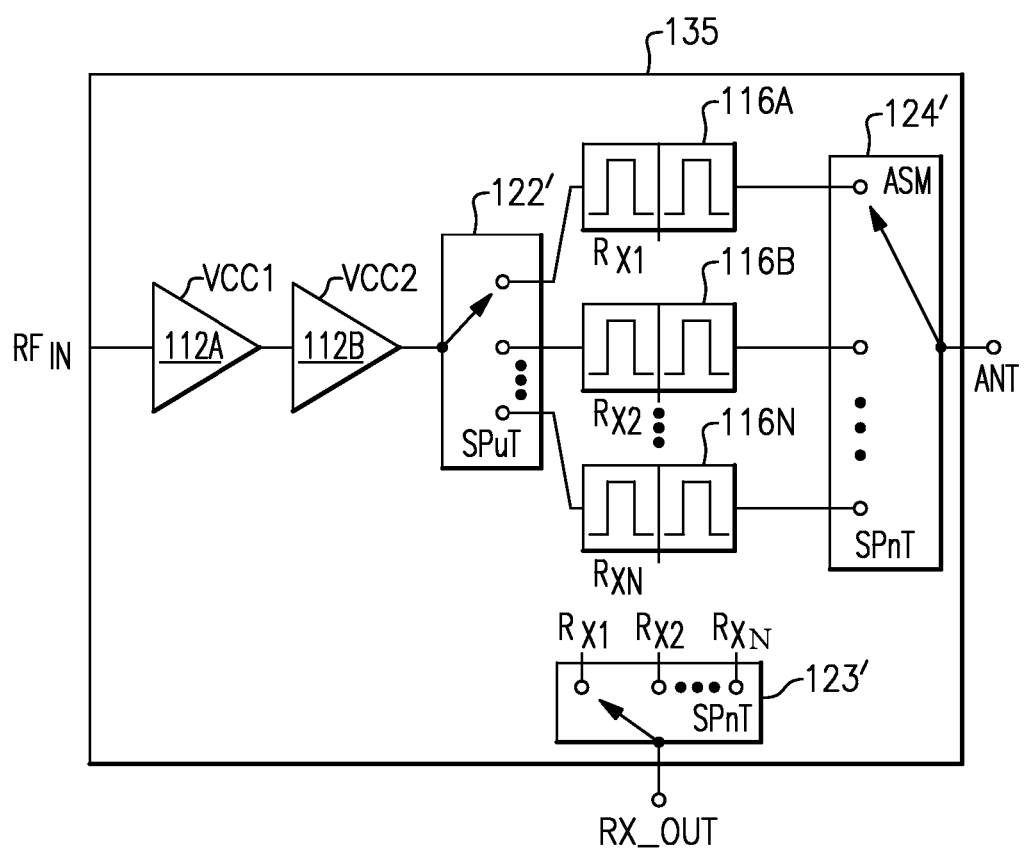
FIG. 13B is a block diagram of a power amplifier module according to an embodiment.

FIG. 13B is a block diagram of an illustrative power amplifier module 135 according to an embodiment. The power amplifier module 135 can implement a broadband power amplifier with duplexers and an antenna switch circuit. As illustrated, the power amplifier module 135 includes a power amplifier, an RF output switch 122', duplexers 116A to 116N, an RF receive switch 123', and an antenna switch circuit 124'.

The RF output switch 122' can electrically couple the output of the power amplifier to a selected duplexer of the duplexers 116A to 116N. The RF output switch 122' can be a multi-throw switch with N throws in which N is an integer greater than 2. As illustrated, the RF output switch 122' is a single pole N throw switch. The selected duplexer of the duplexers 116A to 116N can filter the amplified signal provided by the power amplifier.

The antenna switch circuit 124' can electrically couple a selected duplexer of the duplexers 116A to 116N to an antenna port ANT. The antenna switch circuit 124' can be a multi-throw switch with N throws in which N is an integer greater than 2. As illustrated, the RF output switch 122' is a single pole N throw switch. While the antenna switch circuit 124' and the RF output switch 122' are implemented by RF switches having the same number of throws in FIG. 13B, the antenna switch circuit 124' and the RF output switch 122' can be implemented by RF switches having a different number of throws in some other embodiments. As one example, an RF signal path that includes a second power amplifier can be associated with a throw of the antenna switch circuit 124' although that RF signal path is not associated with a throw of the RF output switch 122'.

The RF receive switch 123' can electrically couple a selected duplexer of the duplexers 116A to 116N to a receive port RX. The RF receive switch 123' can be a multi-throw switch with N throws in which N is an integer greater than 2. As illustrated, the RF output switch 122' is a single pole N throw switch. While the RF receive switch 123' includes the same number throws as the RF output switch 122' and the antenna switch circuit 124' in FIG. 13B, the RF receive switch 123' can be implemented by RF switches having a different number of throws than the RF output switch 122' and/or the antenna switch circuit 124' in some other embodiments. As one example, the RF receive switch 123' can have a throw associated with a second antenna port (not illustrated).

Figure 14:
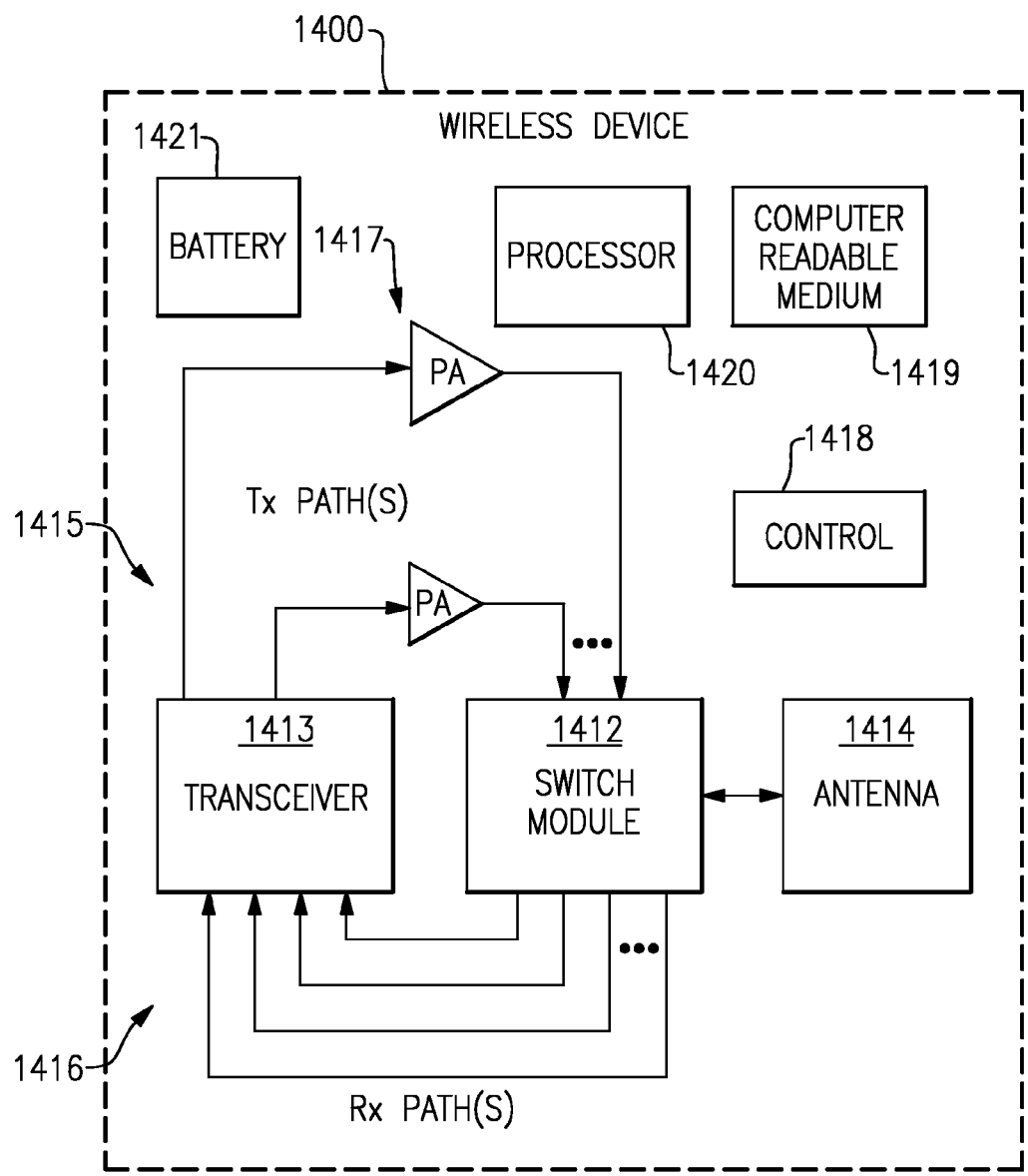
FIG. 14 is a block diagram of an example wireless device that can include power amplifiers according to various embodiments.

FIG. 14 is a schematic block diagram of an example wireless device or mobile device 1400 that includes one or more power amplifiers and/or one or more power amplifier modules according to various embodiments. The wireless device 1420 can include power amplifiers 1417 implementing one or more features of the present disclosure. For instance, the power amplifiers 1417 can include any of the termination circuits and/or the resonant circuits discussed with reference to FIGS. 1A to 6. The wireless device can include a control component 1418 that includes a supply voltage circuit implementing one or more features of the present disclosure. For instance, the control component 1418 can implement any of the principles and advantages discussed herein in connection with envelope tracking.

The example wireless device 1400 depicted in FIG. 14 can represent a multi-band and/or multi-mode device such as a multi-band/multi-mode mobile phone. In certain embodiments, the wireless device 1400 can include a switch module 1412, a transceiver 1413, an antenna 1414, power amplifiers 1417, a control component 1418, a computer readable medium 1419, a processor 1420, and a battery 1421.

The transceiver 1413 can generate RF signals for transmission via the antenna 1414. Furthermore, the transceiver 1413 can receive incoming RF signals from the antenna 1414. It will be understood that various functionalities associated with the transmission and receiving of RF signals can be achieved by one or more components that are collectively represented in FIG. 14 as the transceiver 1413. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 14 as the antenna 1414. For example, a single antenna can be configured to provide both transmitting and receiving functionalities. In another example, transmitting and receiving functionalities can be provided by separate antennas. In yet another example, different bands associated with the wireless device 1400 can be provided with different antennas.

In FIG. 14, one or more output signals from the transceiver 1413 are depicted as being provided to the antenna 1414 via one or more transmission paths 1415. In the example shown, different transmission paths 1415 can represent output paths associated with different bands and/or different power outputs. For instance, the two example power amplifiers 1417 shown can represent amplifications associated with different power output configurations (e.g., low power output and high power output), and/or amplifications associated with different bands. Although FIG. 14 illustrates a configuration using two transmission paths 1415, the wireless device 1400 can include more or fewer transmission paths 1415.

One or more of the power amplifiers 1417 can be configured as class-F power amplifiers in accordance with the principles and advantages discussed herein. The power amplifiers 1417 can be used to amplify a wide variety of RF signals. For example, one or more of the power amplifiers 1417 can amplify a Global System for Mobile (GSM) signal, a code division multiple access (CDMA) signal, a W-CDMA signal, a Long Term Evolution (LTE) signal, an EDGE signal, or a wireless local area network (WLAN) signal, such as a WLAN 802.11g signal. Different power amplifiers of the power amplifiers 1417 can amplify different types of RF signals. One or more features of the present disclosure can be implemented in the foregoing example communication standards, modes and/or bands, and in other communication standards.

In FIG. 14, one or RF signals from the antenna 1414 are depicted as being provided to the transceiver 1413 via one or more receiving paths 1416. In the example shown, different receiving paths 1416 can represent paths associated with different bands. Although FIG. 14 illustrates a configuration using four receiving paths 1416, the wireless device 1400 can be adapted to include more or fewer receiving paths 1416.

To facilitate switching between receive and transmit paths, the switch module 1412 can be configured to electrically connect the antenna 1414 to a selected transmit or receive path. Thus, the switch module 1412 can provide a number of switching functionalities associated with an operation of the wireless device 1400. In certain embodiments, the switch module 1412 can include a number of switches configured to provide functionalities associated with, for example, switching between different bands, switching between different power modes, switching between transmission and receiving modes, or some combination thereof. The switch module 1412 can also be configured to provide additional functionality, including filtering and/or duplexing of signals. For instance, any of the RF switches and/or duplexers of FIGS. 12A to 13B can be included in the switch module 1412.

FIG. 14 shows that in certain embodiments, a control component 1418 can be provided for controlling various control functionalities associated with operations of the switch module 1412, the power amplifiers 1417, and/or other operating component(s). The control component 1418 can be implemented on the same die as the power amplifier 1417 in certain implementations. The control component 1418 can be implemented on a different die than the power amplifier in some implementations. The control component 1418 can include supply voltage and/or biasing circuit. For instance, the control component can implement one or more features of envelope tracking discussed herein. The control component 1418 can provide any other suitable control functionality, such as providing control signals for the switch module 1412.

In certain embodiments, a processor 1420 can be configured to facilitate implementation of any of the processes described herein and/or any other suitable functionality of the wireless device 1400. A computer-readable memory 1419 can store instructions that, when executed, can direct the wireless device 1400 to operate in a particular manner, such that the instructions stored in the computer-readable memory produce an article of manufacture.

The battery 1421 can be any suitable battery for use in the wireless device 1400, including, for example, a lithium-ion battery.

Some of the embodiments described above have provided examples in connection with power amplifiers and/or mobile devices. However, the principles and advantages of the embodiments can be used for any other systems or apparatus that could benefit from any of the circuits described herein. While certain embodiments are discussed with reference to power amplifiers, the principles and advantages discussed herein can be applied to matching networks coupled to other types of amplifiers, such as other amplifiers configured to amplify RF signals. The teachings herein are applicable to a variety of power amplifier systems including systems with multiple power amplifiers, including, for example, multi-band and/or multi-mode power amplifier systems. Although this disclosure includes some example power amplifiers, the teachings described herein can be applied to a variety of power amplifier structures, such as multi-stage power amplifiers and power amplifiers employing other transistor structures. The power amplifier transistors discussed herein can be, for example, gallium arsenide (GaAs) or silicon germanium (SiGe) transistors. Moreover, the principles and advantages discussed herein can be applied to field effect power amplifier transistors and/or bipolar power amplifier transistors, such as heterojunction bipolar transistors.

Aspects of this disclosure can be implemented in various electronic devices. Examples of the electronic devices can include, but are not limited to, consumer electronic products, parts of the consumer electronic products, electronic test equipment, etc. Examples of the electronic devices can include, but are not limited to, a mobile phone such as a smart phone, a telephone, a television, a computer monitor, a computer, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "may," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. The elements and acts of the various embodiments described above can be combined to provide further embodiments. Indeed, the novel apparatus, methods, and systems described herein may be embodied in a variety of other forms; furthermore, various omissions, substitutions and changes in the form of the methods and systems described herein may be made without departing from the spirit of the disclosure. For example, while processes or blocks are presented in a given order, alternative embodiments may perform routines having operations, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A power amplifier system comprising:
a power amplifier transistor configured to receive a radio frequency signal at an input terminal and provide an amplified radio frequency signal at an output terminal;
an envelope tracking modulator and a parallel LC circuit coupled between the envelope tracking modulator and the output terminal of the power amplifier transistor, the envelope tracking modulator configured to provide a supply voltage to the power amplifier transistor by way of the parallel LC circuit;
an input termination circuit coupled to the input terminal of the power amplifier transistor, the input termination circuit configured to provide a short circuit at a second harmonic of the radio frequency signal;
a termination circuit coupled to the output terminal of the power amplifier transistor, the termination circuit configured to provide a short circuit at a second harmonic of the amplified radio frequency signal; and
a resonant circuit coupled to the output of the power amplifier transistor, the resonant circuit configured to provide an open circuit at a third harmonic of the amplified radio frequency signal.

2. The power amplifier system of claim 1 wherein the termination circuit is configured to provide an open circuit at the third harmonic of the amplified radio frequency signal.

3. A power amplifier system comprising:
a power amplifier transistor configured to receive a radio frequency signal at an input terminal and provide an amplified radio frequency signal at an output terminal, the power amplifier transistor being implemented on a power amplifier die;
an input termination circuit coupled to the input terminal of the power amplifier transistor, the input termination circuit configured to provide a short circuit at a second harmonic of the radio frequency signal;
a termination circuit coupled to the output terminal of the power amplifier transistor, the termination circuit including a first LC circuit configured to provide a short circuit at a second harmonic of the amplified radio frequency signal and a second LC circuit configured to provide a short circuit at a different even harmonic of the amplified radio frequency signal, the first LC circuit including a first inductive element external to the power amplifier die, and the second LC circuit including a second inductive element external to the power amplifier die; and
a resonant circuit coupled to the output of the power amplifier transistor, the resonant circuit configured to provide an open circuit at a third harmonic of the amplified radio frequency signal.

4. The power amplifier system of claim 1 wherein the parallel LC circuit is configured to block a fundamental frequency of the amplified radio frequency signal.

5. The power amplifier system of claim 1 wherein the power amplifier transistor includes a bipolar transistor having a collector, a base, and an emitter, the input terminal of the power amplifier transistor being the base, and the output terminal of the power amplifier transistor being the collector.

6. The power amplifier system of claim 1 wherein the power amplifier transistor is implemented on a power amplifier die, and the input termination circuit includes an inductive element external to the power amplifier die.

7. The power amplifier system of claim 1 wherein the termination circuit is configured to provide a short circuit at a different even harmonic of the amplified radio frequency signal.

8. The power amplifier system of claim 3 further comprising an envelope tracking modulator and a parallel LC circuit disposed between the envelope tracking modulator and the output terminal of the power amplifier transistor, the envelope tracking modulator configured to provide a supply voltage to the power amplifier transistor by way of the parallel LC circuit.

9. The power amplifier system of claim 3 wherein the resonant circuit is configured to provide an open circuit at another odd harmonic of the amplified radio frequency signal.

10. The power amplifier system of claim 1 wherein the termination circuit includes a capacitor in parallel with a series LC circuit.

11. The apparatus power amplifier system of claim 1 wherein the resonant circuit includes a second parallel LC circuit.

12. A circuit comprising:
a bipolar power amplifier transistor having a collector, a base, and an emitter, the bipolar power amplifier transistor configured to amplify a radio frequency signal received at the base, and the bipolar power amplifier transistor being implemented on a power amplifier die;
a termination circuit coupled to the collector of the bipolar power amplifier transistor, the termination circuit including a series LC circuit and a second series LC circuit in parallel with the series LC circuit, the series LC circuit including an inductive element external to the power amplifier die; and
a parallel LC circuit coupled in series between the collector and a load.

13. The circuit of claim 12 wherein the bipolar power amplifier transistor, the termination circuit, and the parallel LC circuit are arranged as a class F power amplifier.

14. The circuit of claim 12 further comprising a third series LC circuit coupled to the base of the power amplifier transistor.

15. The circuit of claim 12 further comprising an envelope tracking modulator configured to provide a supply voltage for the collector of the bipolar power amplifier transistor.

16. The circuit of claim 15 further comprising a second parallel LC circuit coupled between the envelope tracking modulator and the collector, the envelope tracking modulator configured to provide the supply voltage to the collector by way of the second parallel LC circuit.

17. A power amplifier module comprising:
a power amplifier transistor configured to receive a radio frequency input signal and provide an amplified radio frequency signal;
a termination circuit coupled to an output of the power amplifier transistor, the termination circuit including a capacitor in parallel with a series LC circuit, a capacitance of the capacitor together with an impedance of the series LC circuit at a third harmonic of the amplified radio frequency signal configured to provide an open circuit at the third harmonic of the amplified radio frequency signal, and the termination circuit configured to provide a short circuit at a second harmonic of the amplified radio frequency signal;

a resonant circuit coupled to the output of the power amplifier transistor, the resonant circuit configured to provide an open circuit at the third harmonic of the amplified radio frequency signal; and a supply voltage circuit including an envelope tracking modulator and a parallel LC circuit disposed between the envelope tracking modulator and the power amplifier transistor, the envelope tracking modulator configured to provide a supply voltage to the power amplifier transistor by way of the parallel LC circuit.

18. The power amplifier module of claim 17 further comprising an input termination circuit configured to provide a short circuit at a second harmonic of the radio frequency input signal, the input termination circuit being coupled to an input of the power amplifier transistor.

19. The power amplifier module of claim 17 wherein the power amplifier transistor includes a heterojunction bipolar transistor.

20. The circuit of claim 12 further comprising an input termination circuit coupled to the base of the bipolar power amplifier transistor, the input termination circuit configured to provide a short circuit at a second harmonic of the radio frequency signal.

* * * * *

UNITED STATES PATENT AND TRADEMARK OFFICE
CERTIFICATE OF CORRECTION

PATENT NO. : 9,503,025 B2  
APPLICATION NO. : 14/671079  
DATED : November 22, 2016  
INVENTOR(S) : Haibo Cao et al.

Page 1 of 1

It is certified that error appears in the above-identified patent and that said Letters Patent is hereby corrected as shown below:

In the Specification

In Column 8 at Lines 9-12, change "$4\omega_T = \dfrac{1}{\sqrt{L_{2T} * C_{2T}}}$" to -- $4\omega_T = \dfrac{1}{\sqrt{L_{4T} * C_{4T}}}$ --.

In the Claims

In Column 22 at Line 31, in Claim 11, after "The" delete "apparatus".

Signed and Sealed this  
Eighteenth Day of April, 2017

Michelle K. Lee  
*Director of the United States Patent and Trademark Office*